(12) United States Patent
Kim et al.

(10) Patent No.: US 11,653,504 B2
(45) Date of Patent: May 16, 2023

(54) SEMICONDUCTOR MEMORY DEVICE WITH SELECTION TRANSISTORS WITH SUBSTRATE PENETRATING GATES

(71) Applicant: Samsung Electronics Co., Ltd., Suwon-si (KR)

(72) Inventors: Song Yi Kim, Yongin-si (KR); Junghyun Cho, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 17/232,865

(22) Filed: Apr. 16, 2021

(65) Prior Publication Data

US 2022/0005869 A1 Jan. 6, 2022

(30) Foreign Application Priority Data

Jul. 2, 2020 (KR) .................. 10-2020-0081578
Oct. 14, 2020 (KR) .................. 10-2020-0132808

(51) Int. Cl.
*H10B 63/00* (2023.01)
*G11C 13/00* (2006.01)
(Continued)

(52) U.S. Cl.
CPC ............ *H10B 63/84* (2023.02); *G11C 7/12* (2013.01); *G11C 7/18* (2013.01); *G11C 8/14* (2013.01); *G11C 13/0026* (2013.01); *G11C 13/0028* (2013.01); *H10B 63/30* (2023.02); *H10N 70/231* (2023.02); *H10N 70/253* (2023.02); *H10N 70/841* (2023.02)

(58) Field of Classification Search
CPC ............ H01L 27/2481; H01L 27/2436; H01L 45/06; H01L 45/1206; H01L 45/1253; H01L 27/2409; H01L 45/141; G11C 7/12; G11C 7/18; G11C 8/14; G11C 13/0026; G11C 13/0028; G11C 5/025; G11C 2213/71; G11C 2213/72; G11C 13/0004; H10B 63/84; H10B 63/30; H10B 63/20; H10N 70/231; H10N 70/253; H10N 70/841; H10N 70/882

See application file for complete search history.

(56) References Cited

U.S. PATENT DOCUMENTS 7,778,059 B2   8/2010 Chang
8,102,729 B2   1/2012 Lee et al.
(Continued)

*Primary Examiner* — Jerome Leboeuf
(74) *Attorney, Agent, or Firm* — Muir Patent Law, PLLC

(57) ABSTRACT

A semiconductor memory device including a device isolation layer in a substrate to define first and second active portions, a first contact on the substrate, first and second memory cells spaced apart from the first contact in a first direction by first and second distances, respectively, first and second conductive lines connected to the first and second memory cells, respectively, and extending in a second direction, and first and second selection transistors respectively connected to the first and second conductive lines. A length of a bottom surface of a first gate electrode of the first selection transistor overlapping the first active portion in a third direction may be different from a length of a bottom surface of a second gate electrode of the second selection transistor overlapping the second active portion in the third direction.

17 Claims, 26 Drawing Sheets

(51) Int. Cl.
   *G11C 7/12*   (2006.01)
   *G11C 7/18*   (2006.01)
   *G11C 8/14*   (2006.01)

(56) References Cited

U.S. PATENT DOCUMENTS

| | | |
|---|---|---|
| 8,295,076 B2 | 10/2012 | Jeon et al. |
| 8,493,769 B2 | 7/2013 | Eun et al. |
| 8,730,731 B2 | 5/2014 | Kim et al. |
| 9,202,566 B2 | 12/2015 | Siau et al. |
| 9,922,977 B2 | 3/2018 | Arghavani et al. |
| 2012/0248400 A1* | 10/2012 | Yu .................. H01L 27/2409 257/E47.001 |
| 2013/0285006 A1* | 10/2013 | Park ................. H01L 45/1683 257/5 |
| 2015/0263069 A1* | 9/2015 | Jo .................... H01L 27/249 257/4 |
| 2016/0190208 A1* | 6/2016 | Nazarian ........... H01L 27/2436 438/238 |
| 2018/0012936 A1* | 1/2018 | Kang ................. G11C 13/0002 |
| 2019/0043923 A1 | 2/2019 | Ahmed et al. |
| 2020/0105345 A1 | 4/2020 | Baek et al. |
| 2020/0111835 A1 | 4/2020 | Cho et al. |

* cited by examiner

SEMICONDUCTOR MEMORY DEVICE WITH SELECTION TRANSISTORS WITH SUBSTRATE PENETRATING GATES

CROSS-REFERENCE TO RELATED APPLICATIONS

This U.S. non-provisional patent application claims priority under 35 U.S.C. § 119 to Korean Patent Application Nos. 10-2020-0081578 and 10-2020-0132808, respectively, filed on Jul. 2, 2020 and Oct. 14, 2020, in the Korean Intellectual Property Office, the entire contents of which are hereby incorporated by reference.

BACKGROUND OF THE INVENTION

The present disclosure relates to a semiconductor memory device, and in particular, to a semiconductor memory device with an increased integration density.

In general, semiconductor memory devices are classified into volatile memory devices and nonvolatile memory devices. The volatile memory devices lose their stored data when their power supply is interrupted, and a dynamic random access memory (DRAM) device and a static random access memory (SRAM) device are typical examples of the volatile memory devices. By contrast, the nonvolatile memory devices retain their data even when their power supply is interrupted and a programmable read only memory (PROM) device, an erasable PROM (EPROM) device, an electrically EPROM (EEPROM) device, and a flash memory device are typical examples of the nonvolatile memory devices.

SUMMARY

An embodiment of the inventive concept provides a semiconductor memory device with an increased integration density and an improved operation property.

According to an embodiment of the inventive concept, a semiconductor memory device may include a device isolation layer provided in a substrate to define a first active portion and a second active portion, a first contact disposed on the substrate, a first memory cell and a second memory cell, which are spaced apart from the first contact in a first direction by a first distance and a second distance, respectively, a first conductive line connected to the first memory cell and extending in a second direction crossing the first direction, a second conductive line connected to the second memory cell and extending in the second direction, a first selection transistor connected to the first conductive line and disposed in the first active portion, and a second selection transistor connected to the second conductive line and including the second active portion. The first selection transistor may include a first gate electrode crossing the first active portion in a third direction, the third direction being the same as or different from the second direction, and the second selection transistor may include a second gate electrode crossing the second active portion in the third direction. A length of a bottom surface of the first gate electrode, which overlaps the first active portion in the third direction, may be different from a length of a bottom surface of the second gate electrode, which overlaps the second active portion in the third direction.

According to an embodiment of the inventive concept, a semiconductor memory device may include a cell array portion disposed on a peripheral circuit portion. The cell array portion may include first conductive lines, which extend in a first direction and are spaced apart from each other in a second direction crossing the first direction, second conductive lines, which cross over the first conductive lines in the second direction and are spaced apart from each other in the first direction, and memory cells, which are respectively disposed between the first conductive lines and the second conductive lines. The peripheral circuit portion may include a first conductive line selection region, which is disposed in a substrate to cross the first conductive lines and is connected to the first conductive lines, and a second conductive line selection region, which is disposed in the substrate to cross the second conductive lines and is connected to the second conductive lines. The memory cells may include near memory cells and far memory cells. The near memory cells may be closer to both of the first conductive line selection region and the second conductive line selection region than the far memory cells, and the far memory cells may be farther from both of the first conductive line selection region and the second conductive line selection region than the near memory cells. The first conductive line selection region may include a first near selection region selecting the near memory cells and a first far selection region selecting the far memory cells. A threshold voltage of a first near selection transistor disposed in the first near selection region may be higher than a threshold voltage of a first far selection transistor disposed in the first far selection region.

According to an embodiment of the inventive concept, a semiconductor memory device may include a first lower conductive line disposed on a substrate, a first upper conductive line and a second upper conductive line, which cross over the first lower conductive line and are parallel to each other, the first upper conductive line being close to an end portion of the first lower conductive line than the second upper conductive line, a first memory cell interposed between the first lower conductive line and the first upper conductive line, a second memory cell interposed between the first lower conductive line and the second upper conductive line, a first selection transistor connected to the first upper conductive line; and a second selection transistor connected to the second upper conductive line. The first selection transistor may have a first gate electrode, and the second selection transistor may have a second gate electrode. The first gate electrode may include at least one first gate protruding portion inserted into the substrate.

DETAILED DESCRIPTION

Example embodiments of the inventive concepts will now be described more fully with reference to the accompanying drawings, in which example embodiments are shown.

Figure 1:
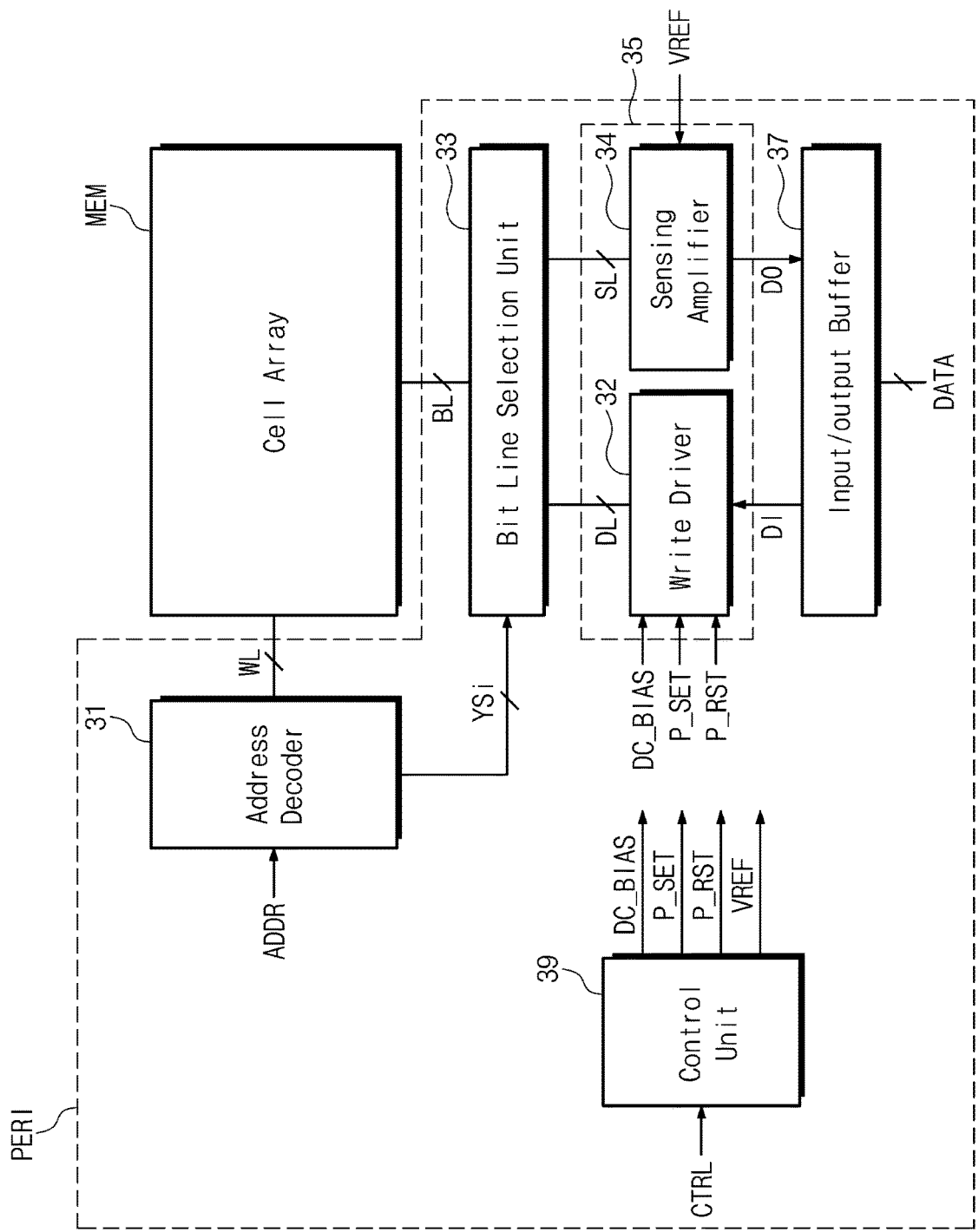
FIG. 1 is a block diagram schematically illustrating a semiconductor memory device according to an embodiment of the inventive concept.

FIG. 1 is a block diagram schematically illustrating a semiconductor memory device according to an embodiment of the inventive concept.

Referring to FIG. 1, a semiconductor memory device may include a memory region MEM and a peripheral circuit region PERI around the memory region MEM.

In an embodiment, a memory cell array and cell driving circuits driving memory cells may be disposed in the memory region MEM. The memory cell array may include a plurality of word lines WL and a plurality of bit lines BL, and the memory cells may be disposed at intersections between the word lines WL and the bit lines BL. Each of the memory cells may include a variable resistance pattern whose resistance state can be switched between two different states by an electric pulse applied thereto. For example, the variable resistance pattern may be formed of or include at least one of phase-change materials, transition metal oxides, or magnetic materials. In an embodiment, the memory cells may be formed of or include a phase-change material whose crystal state can be changed by a current amount applied thereto. The memory cells and the cell selection circuits will be described in more detail with reference to FIGS. 2 and 3.

An address decoder 31, a bit line selection unit 33, a data input/output circuit 35, an input/output buffer 37, and a control unit 39 may be disposed in the peripheral circuit region PERI.

The address decoder 31 may decode an address ADDR, which is input from the outside, to select the word line WL and the bit line BL. The address ADDR may include a row address for selecting the word line WL and a column address for selecting the bit line BL. The address decoder 31 may generate a bit line selection signal YSi, which is used to select the bit line BL, and may provide the bit line selection signal YSi to the bit line selection unit 33.

The bit line selection unit 33 may be connected to the memory region MEM through the bit lines BL and may be connected to the data input/output circuit 35 through a data line DL and a sensing line SL. The bit line selection unit 33 may electrically connect the bit line BL to the data line DL or to the sensing line SL, in response to the bit line selection signal YSi provided from the address decoder 31. In an embodiment, the bit lines BL connected to the memory cell may have a hierarchical structure including a plurality of global bit lines GBL0 (e.g., see FIG. 2) and a plurality of local bit lines LBL0 to LBL3 (e.g., see FIG. 2). In this case, the bit line selection unit 33 may include a global bit line selection unit, which is configured to select one of the global bit lines GBL0 (e.g., see FIG. 2), and a local bit line selection unit, which is configured to select one of the local bit lines LBL0 to LBL3 (e.g., see FIG. 2). Furthermore, in an embodiment, the global bit line selection unit may be disposed in the peripheral circuit region PERI, and the local bit line selection unit may be disposed in the memory region MEM.

The data input/output circuit 35 may be configured to write data DI to the memory cell array and to read data DO from the memory cell array. To do this, the data input/output circuit 35 may include a write driver 32 and a sensing amplifier 34.

When the write operation is performed, the write driver 32 may provide a program or write current to the selected one of the bit lines BL through the data line DL. More specifically, the write driver 32 may receive a set pulse P_SET or a reset pulse P_RST from the control unit 39 to produce a set current or reset current. The write driver 32 may receive the data DI from the input/output buffer 37 to provide the set or reset current to the selected one of the bit lines BL through the bit line selection unit 33. In addition, the write driver 32 may control an amount of a current, which is provided to the selected one of the bit lines BL, based on a bias voltage DC_BIAS provided from the control unit 39. For example, the write driver 32 may provide the set current to the memory cell, in response to the set pulse P_SET, when data '0' is input, and may provide the reset current to the memory cell, in response to the reset pulse P_RST, when data '1' is input.

When the read operation is performed, the sensing amplifier 34 may read the data DO of a selected memory cell through the sensing line SL. More specifically, when the read operation is performed, the sensing amplifier 34 may provide a read current to the memory cell array through the sensing line SL. When the read operation is performed, the sensing amplifier 34 may compare a voltage of the sensing line SL with a reference voltage to read the data DO stored in the memory cell. The data DO, which is read through the sensing amplifier 34, may be output the outside through the input/output buffer 37.

The input/output buffer 37 may provide data DATA, which is input from the outside, to the write driver 32 or may output the data DATA, which is read by the sensing amplifier 34, to the outside.

The control unit 39 may output control signals, which are used to control the semiconductor memory device, based on command signals CTRL provided from the outside. In other words, the control unit 39 may control the operation of the write driver 32 in the write operation and may control the operation of the sensing amplifier 34 in the read operation. In detail, when the write operation is performed, the control unit 39 may provide the set pulse P_SET or the reset pulse P_RST, which is used to produce a program current, to the write driver 32. In addition, the control unit 39 may provide the bias voltage DC_BIAS, which is used to control an amount of a current to be supplied to the memory cell, to the write driver 32. Furthermore, when the read operation is performed, the control unit 39 may provide a reference voltage VREF, which is compared with the voltage of the sensing line SL, to the sensing amplifier 34.

Figure 2:
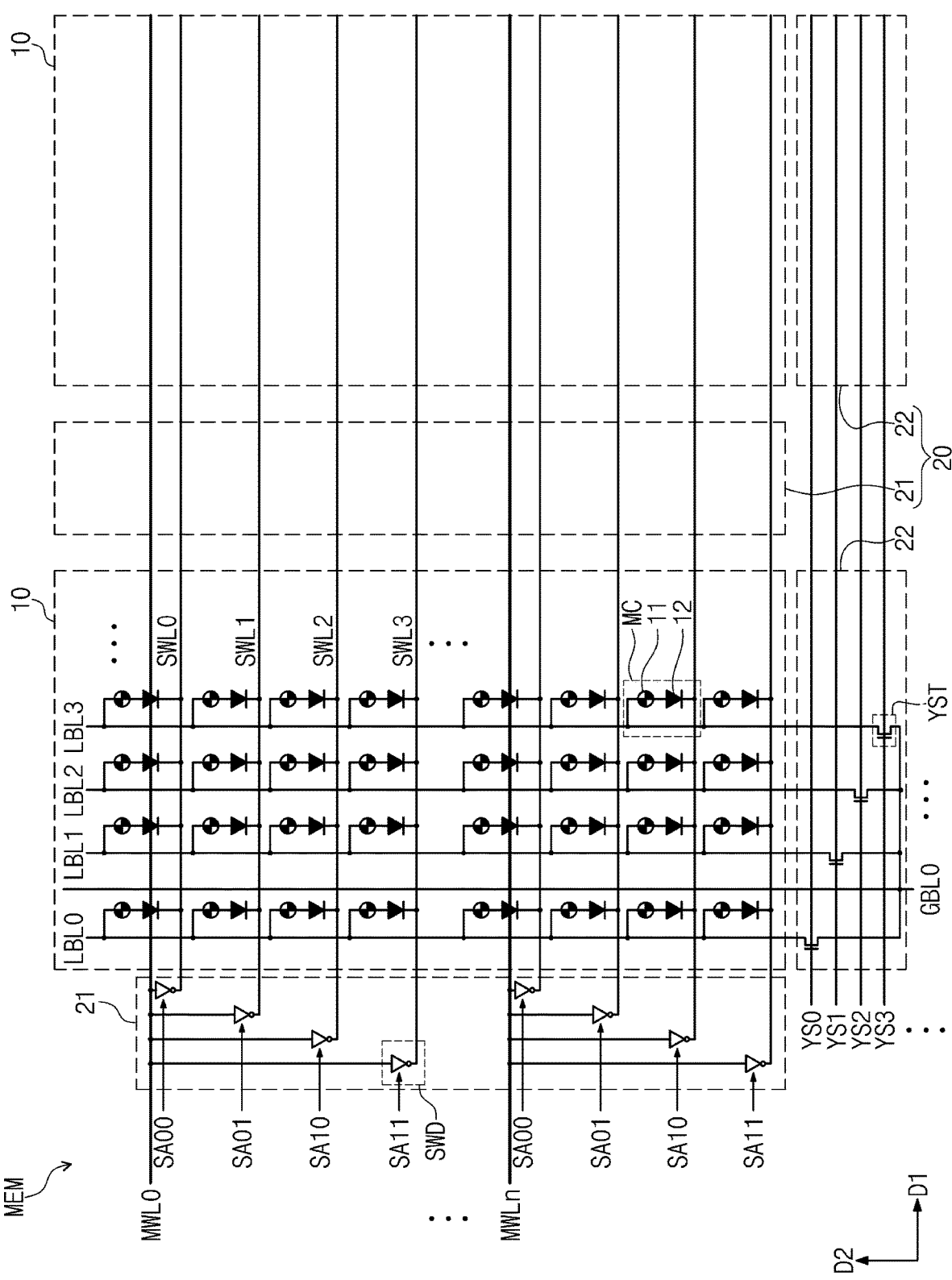
FIG. 2 is a schematic circuit diagram illustrating a memory region of a semiconductor memory device according to an embodiment of the inventive concept.

FIG. 2 is a schematic circuit diagram illustrating a memory region of a semiconductor memory device according to an embodiment of the inventive concept.

Referring to FIG. 2, the memory region MEM may include cell array regions 10 and core regions 20 near the cell array regions 10.

The word lines WL and the bit lines BL may be disposed in the cell array region 10, and memory cells MC may be connected to intersections or cross-points between the word line WL and the bit line BL. In an embodiment, the memory cells MC may be formed of or include a phase-change material whose crystal state can be changed by a current amount applied thereto.

The core region 20 may include a word line driver region 21, in which a word line driver SWD to select the word lines WL is disposed, and a bit line selection region 22, in which bit line selection circuits YST to select the bit lines BL are provided.

The cell array regions 10 may be two-dimensionally arranged, and the core region 20 may be disposed between the cell array regions 10. In an embodiment, the word line driver region 21 may be disposed between the cell array regions 10, which are adjacent to each other in a first direction D1, and the bit line selection region 22 may be disposed between the cell array regions 10, which are adjacent to each other in a second direction D2.

More specifically, each of the cell array regions 10 may include the word lines WL, the bit lines BL, and the memory cells MC. In an embodiment, the word lines WL may have a hierarchical word line structure including a plurality of main word lines MWL and a plurality of sub-word lines SWL, as shown in FIG. 2. Also, the bit lines BL may have a hierarchical bit line structure including a plurality of global bit lines GBL and a plurality of local bit lines LBL. Here, a plurality of the sub-word lines SWL may be selectively connected to one of the main word lines MWL through the word line drivers SWD. The local bit lines LBL may be selectively connected to a corresponding one of the global bit lines GBL through the bit line selection circuits YST. In this structure, the memory cells MC may be connected to cross-points or intersections of the sub-word line SWL and the local bit line LBL. In an embodiment, each of the memory cells MC may include a variable resistance pattern 11 and a switching device 12. The variable resistance pattern 11 may be provided between and connected to the local bit line LBL and the switching device 12, and the switching device 12 may be provided between and connected to the variable resistance pattern 11 and the sub-word line SWL.

The variable resistance pattern 11 may be formed of or include a material whose resistance state can be switched to two different states by an electric pulse applied thereto. The following description will refer to an example, in which the variable resistance pattern 11 includes a phase-change material (e.g., Ge—Sb—Te (GST)) having a temperature-dependent resistance property. The phase-change material may have an amorphous state and crystal state, which have relatively high resistance and relatively low resistance, respectively, depending on its heating temperature and cooling condition. The crystalline state of the variable resistance pattern 11 may be changed by an amount of current supplied through the local bit line LBL. In detail, the phase-change material of the variable resistance pattern 11 may be heated by current supply to a temperature higher than its melting temperature for a first time period and then rapidly cooled to have an amorphous state. When the phase-change material is in the amorphous state, the memory cell MC may be in a 'RESET' state or a state of data '1'. In addition, the phase-change material may have the crystal state, when it is heated to a temperature, which is higher than its crystallization temperature and is lower than its melting temperature, and then is slowly cooled during a second time period that is longer than the first time period. When the phase-change material is in the crystal state, the memory cell MC may be in a 'SET' state or a state of data '0'. According to the afore-described process, data may be stored in the memory cell MC by supplying a current to the phase-change material, and the data stored in the memory cell MC may be read by measuring the resistance value of the phase-change material.

The variable resistance pattern 11 may be formed of a compound containing at least one of chalcogenide elements (e.g., Te, Se, and S) and at least one of, for example, Ge, Sb, Bi, Pb, Sn, Ag, As, Si, In, Ti, Ga, P, O, or C. As an example, the variable resistance pattern 11 may be formed of or include at least one of binary compounds (e.g., GeTe, GeSe, GeS, SbSe, SbTe, SbS, SnSb, InSe, InSb, AsTe, AlTe, GaSb, AlSb, BiSb, ScSb, Ysb, CeSb, DySb, and NdSb), ternary compounds (e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS), quaternary compounds (e.g., GeSbTeS, BiSbTeSe, AgInSbTe, GeSb- SeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS), or quinary compounds (e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn). The variable resistance pattern 11 may be composed of a single layer, which is formed of or includes one of the above materials, but in an embodiment, the variable resistance pattern 11 may include a plurality of layers, each of which is formed of or includes one of the above materials. Alternatively, the variable resistance pattern 11 may have a super lattice structure, in which Ge-containing layers and Ge-free layers are repeatedly stacked. As an example, the variable resistance pattern 11 may have a structure, in which GeTe layers and $Sb_2Te_3$ layers are (alternately) repeatedly stacked or GeTe layers and $Bi_2Te_3$ layers are (alternately) repeatedly stacked. In addition, the variable resistance pattern 11 may further include at least one of B, C, N, O, P, Cd, W, Ti, Hf, or Zr as an additive element to the afore-described materials.

In an embodiment, the switching device 12 may be a PN junction diode. When the switching device 12 is the PN junction diode, the anode of the diode may be connected to the variable resistance pattern 11, and the cathode of the diode may be connected to the sub-word line SWL. In this case, if a voltage difference between the anode and cathode of the diode is greater than a threshold voltage of the diode, the diode may be turned on and thus a current may be supplied to the variable resistance pattern 11.

Alternatively, the switching device 12 may be an Ovonic threshold switch (OTS) device having a bi-directional property. As an example, the switching device 12 may be one of devices which exhibit a non-linear threshold switching property (e.g., a 'S'-shaped I-V curve). The switching device 12 may have a crystal-amorphous phase transition temperature that is higher than that of the variable resistance pattern 11. For example, the phase transition temperature of the switching device 12 may range from about 350° C. to about 450° C. Thus, under an operation voltage applied during the operation of the memory cell MC, the phase of the variable resistance pattern 11 may be reversibly changed between crystal and amorphous states, whereas the phase of the switching device 12 may not be changed from its initial state (e.g., a substantially amorphous state). In the present specification, the expression 'substantially amorphous state' is not used to exclude a case in which a local crystal grain or a locally-crystallized portion exists in an object.

The switching device 12 may be formed of a compound containing at least one of chalcogenide elements (e.g., Te, Se, and S) and at least one of, for example, Ge, Sb, Bi, Al, Pb, Sn, Ag, As, Si, In, Ti, Ga and P. As an example, the switching device 12 may be formed of or include at least one of binary compounds (e.g., GeSe, GeS, AsSe, AsTe, AsS SiTe, SiSe, SiS, GeAs, SiAs, SnSe, and SnTe), ternary compounds (e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe), quaternary compounds (e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn), quaternary compounds (e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn), or senary compounds (e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTi, GeAsSeTeInZn, GeAsSeTeInSn, GeAsSeTeGaAl, GeAsSeTeGaTi, GeAsSeTeGaZn, GeAsSeTeGaSn, GeAsSeTeAlSn, GeAsSeSInGa, GeAsSeSInAi, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn).

The switching device 12 may be composed of a single layer, which is formed of or includes one of the above materials, but in an embodiment, the switching device 12 may include a plurality of layers, each of which is formed of or includes one of the above materials. In addition, the switching device 12 may further include at least one of B, C, N, or O as an additive element to the afore-described materials.

In an embodiment, the word line drivers SWD may be disposed in the word line driver region 21 and may be configured to connect one of the sub-word lines SWL to the main word line MWL in response to sub-word line selection signals SAi. Each of the word line drivers SWD may include an inverter composed of metal oxide semiconductor (MOS) transistors. In addition, the main word lines MWL may be connected to the address decoder 31 of the peripheral circuit region PERI (e.g., see FIG. 1).

In an embodiment, the bit line selection circuits YST may be disposed in the bit line selection region 22 and may be configured to connect one of the local bit lines LBL to the global bit line GBL in response to the local bit line selection signals YSi. Here, the bit line selection circuits YST may include MOS transistors. In addition, the global bit lines GBL may be connected to the address decoder 31 and the bit line selection unit 33 of the peripheral circuit region PERI (e.g., see FIG. 1). In an embodiment, when the bit lines have the hierarchical structure including the global bit lines GBL and the local bit lines LBL, the local bit line selection circuits YST may be disposed in the bit line selection region 22.

In an embodiment, when the variable resistance pattern 11 includes a phase-change material whose crystal state is changed by a current amount applied thereto, the word line drivers SWD and the bit line selection circuits YST in the core region 20 may be configured to control an amount of a current to be supplied to the memory cells MC. For example, the current amount supplied to the variable resistance patterns 11 may be controlled by driving performance of the word line drivers SWD and the bit line selection circuits YST.

In the case where the word line drivers SWD and the bit line selection circuits YST are composed of MOS transistors, a ratio of an occupying area of the MOS transistor and the interconnection structure connected thereto to a total area of the semiconductor memory device may be increased, because the MOS transistors are respectively connected to the sub-word lines SWL and the local bit lines LBL. For example, in the semiconductor memory device, the occupying area of the core region 20 may be larger than the occupying area of the cell array region 10. In this case, it is difficult to increase an integration density of the semiconductor memory device.

In addition, the driving performance of the MOS transistors constituting the word line drivers SWD and the bit line selection circuits YST may be improved by increasing the size of the MOS transistor. However, if the physical size of the MOS transistor is increased, the area of the core region 20 may also be increased, and in this case, it is disadvantageous to increase an integration density of the semiconductor memory device. According to an embodiment of the inventive concept, in order to overcome these limitations, the core region 20 may be disposed below the cell array region 10, as shown in FIGS. 8 to 17. In this case, it may be possible to provide a highly-integrated semiconductor memory device. This will be described in more detail below.

Figure 3:
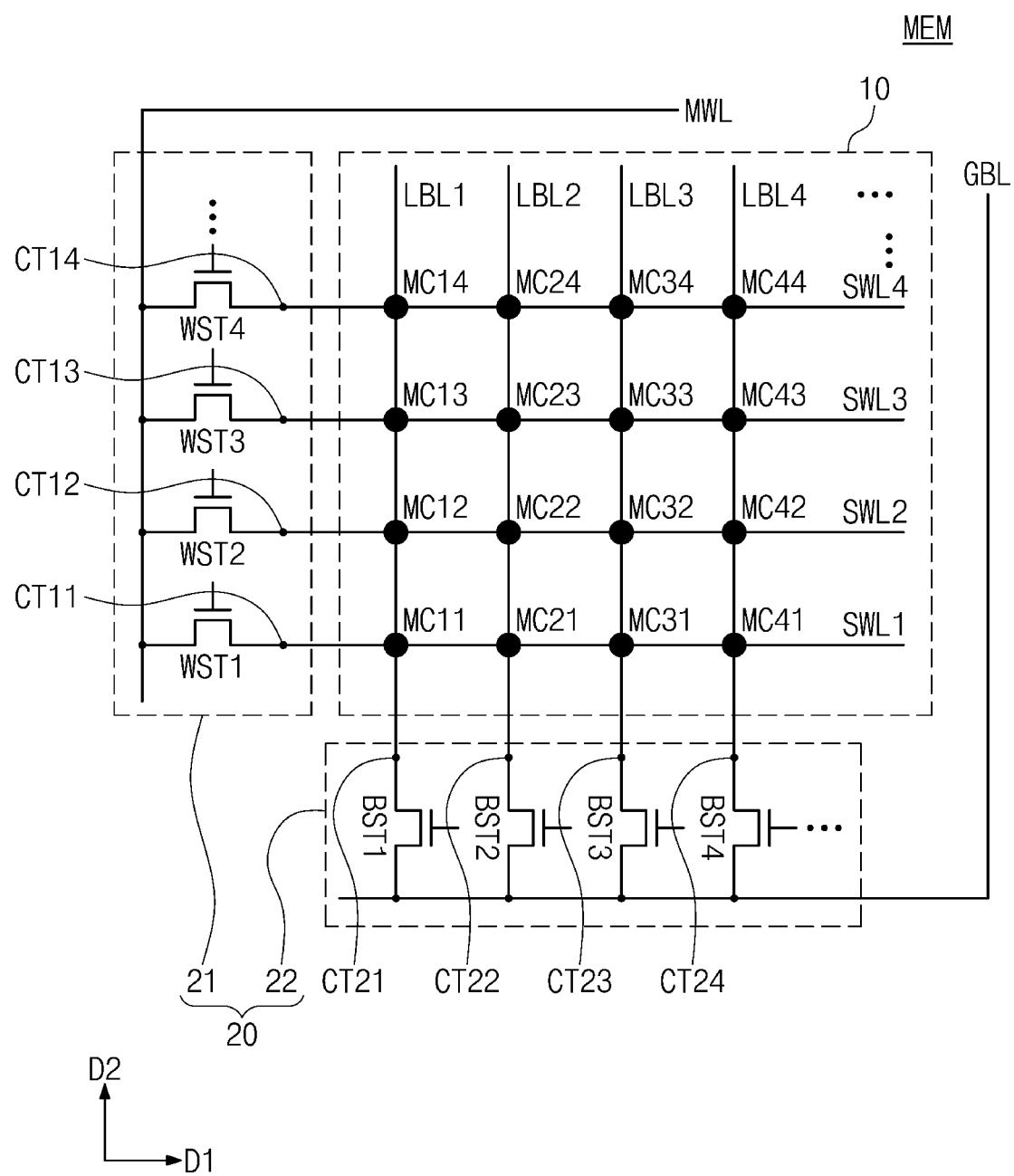
FIG. 3 is a circuit diagram illustrating a portion of a memory region of a semiconductor memory device according to an embodiment of the inventive concept.

FIG. 3 is a circuit diagram illustrating a portion of a memory region of a semiconductor memory device according to an embodiment of the inventive concept.

Referring to FIG. 3, in each cell array region 10, the sub-word lines SWL1 to SWL4 and the local bit lines LBL1 to LBL4 may be disposed to cross each other. Memory cells MC11 to MC44 may be arranged at intersections between the sub-word lines SWL1 to SWL4 and the local bit lines LBL1 to LBL4.

Word line selection transistors WST1 to WST4 may be disposed in the word line driver region 21. The word line selection transistors WST1 to WST4 may be included in the word line drivers SWD. Terminals of the word line selection transistors WST1 to WST4 may be respectively connected to end portions of the sub-word lines SWL1 to SWL4 through word line connection contacts CT11 to CT14. Bit line selection transistors BST1 to BST4 may be disposed in the bit line selection region 22. The bit line selection transistors BST1 to BST4 may be included in the local bit line selection circuits YST. Terminals of the bit line selection transistors BST1 to BST4 may be respectively connected to end portions of the local bit lines LBL1 to LBL4 through bit line connection contacts CT21 to CT24.

In the case where the first word line selection transistor WST1 is turned on to apply a voltage to the first sub-word line SWL1, as the distance from the first word line connection contact CT11 gets farther, the voltage drop may get bigger because of an internal resistance of the first sub-word line SWL1. For example, there may be a difference between voltages that are applied to the 11-th and 41-th memory cells MC11 and MC41, which are respectively closest to and farthest from the first word line connection contact CT11.

In the case where the fourth bit line selection transistor BST4 is turned on to apply a voltage to the fourth local bit line LBL4, as the distance from the fourth bit line connection contact CT24 gets farther, the voltage drop may get bigger because of an internal resistance of the fourth local bit line LBL4.

Since the 11-th memory cell MC11 is close to both of the first word line connection contact CT11 and the first bit line connection contact CT21, a target voltage may be applied to the 11-th memory cell MC11 without substantial loss in voltage. However, since the 44-th memory cell MC44 is far from both of the fourth word line connection contact CT14 and the fourth bit line connection contact CT24, a voltage lower than the target voltage may be applied to the 44-th memory cell MC44. In this sense, the 11-th memory cell MC11 may be referred to as a near memory cell, and the 44-th memory cell MC44 may be referred to as a far memory cell.

Due to this difference between voltages applied to the near and far memory cells, an error may occur when read/write operations are performed on the semiconductor memory device. For example, if a relatively high voltage is applied to the sub-word lines SWL1 to SWL4 and/or the local bit lines LBL1 to LBL4 to operate the far memory cell, the near memory cell may suffer from failures, such as spike/surge current. For example, the variable resistance pattern 11 connected to the near memory cell MC may be damaged or may be unintentionally programmed. By contrast, if a relatively low voltage is applied to the near memory cell to prevent the damage issue, it may be difficult to perform read and write operations on the far memory cell.

According to an embodiment of the inventive concept, the selection transistor connected to the near memory cell may be configured to have a threshold voltage that is higher than that of the selection transistor connected to the far memory cell, and in this case, it may be possible to overcome the above issues. For example, the selection transistor, which is connected to the near memory cell, may be configured to be turned on when it is applied with a relatively high voltage (e.g., compared with the selection transistor connected to the far memory cell), and in this case, it may be possible to prevent a spike/surge current from being applied to the near memory cell.

As a detailed example, the threshold voltage of the first word line selection transistor WST1 connected to the 11-th memory cell MC11 or the near memory cell may be higher than the threshold voltage of the fourth word line selection transistor WST4 connected to the 44-th memory cell MC44. The threshold voltage of the first bit line selection transistor BST1 connected to the 11-th memory cell MC11 or the near memory cell may be higher than the threshold voltage of the fourth bit line selection transistor BST4 connected to the 44-th memory cell MC44. Detailed examples thereof will be described with reference to FIGS. 4A to 4C.

Alternatively, to avoid the above issues, the selection transistor connected to the near memory cell may be configured to have an effective gate width that is smaller than an effective gate width of the selection transistor connected to the far memory cell. In this case, an amount of current supplied to the near memory cell may be relatively small, compared to an amount of current supplied to the far memory cell. Accordingly, it may be possible to prevent the spike/surge current from being applied to the near memory cell and thereby to prevent a failure from occurring in the near memory cell.

As a detailed example, the first word line selection transistor WST1, which is connected to the 11-th memory cell MC11 or the near memory cell, may be configured to have an effective gate width that is smaller than that of the fourth word line selection transistor WST4 connected to the 44-th memory cell MC44. The first bit line selection transistor BST1, which is connected to the 11-th memory cell MC11 or the near memory cell, may be configured to have an effective gate width that is smaller than that of the fourth bit line selection transistor BST4 connected to the 44-th memory cell MC44. Some examples of this will be described in more detail with reference to FIGS. 5A to 7D.

The 12-th, 22-th, and 21-th memory cells MC12, MC22, and MC21, which are adjacent to the 11-th memory cell MC11, may be included in the near memory cells. The 34-th, 33-th, and 43-th memory cells MC34, MC33, and MC43, which are adjacent to the 44-th memory cell MC44, may be included in the far memory cells. Thus, the word line selection transistors WST1 and WST2 and the bit line selection transistors BST1 and BST2, which are connected to the 11-th, 12-th, 22-th, and 21-th memory cells MC11, MC12, MC22, and MC21, and the word line selection transistors WST3 and WST4 and the bit line selection transistors BST3 and BST4, which are connected to the 34-th, 33-th, and 43-th memory cells MC34, MC33, and MC43, may be configured to have substantially the same or similar features as those described above. For example, the threshold voltage of the word line selection transistors WST1 and WST2 may be higher than the threshold voltage of the word line selection transistors WST3 and WST4. Also, the threshold voltage of the bit line selection transistors BST1 and BST2 may be higher than the threshold voltage of the bit line selection transistors BST3 and BST4. In another example, the word line selection transistors WST1 and WST2 may be configured to have an effective gate width that is smaller than the word line selection transistors WST3 and WST4. Also, the effective gate width of the bit line selection transistors BST1 and BST2 may be smaller than the bit line selection transistors BST3 and BST4.

Figure 4A:
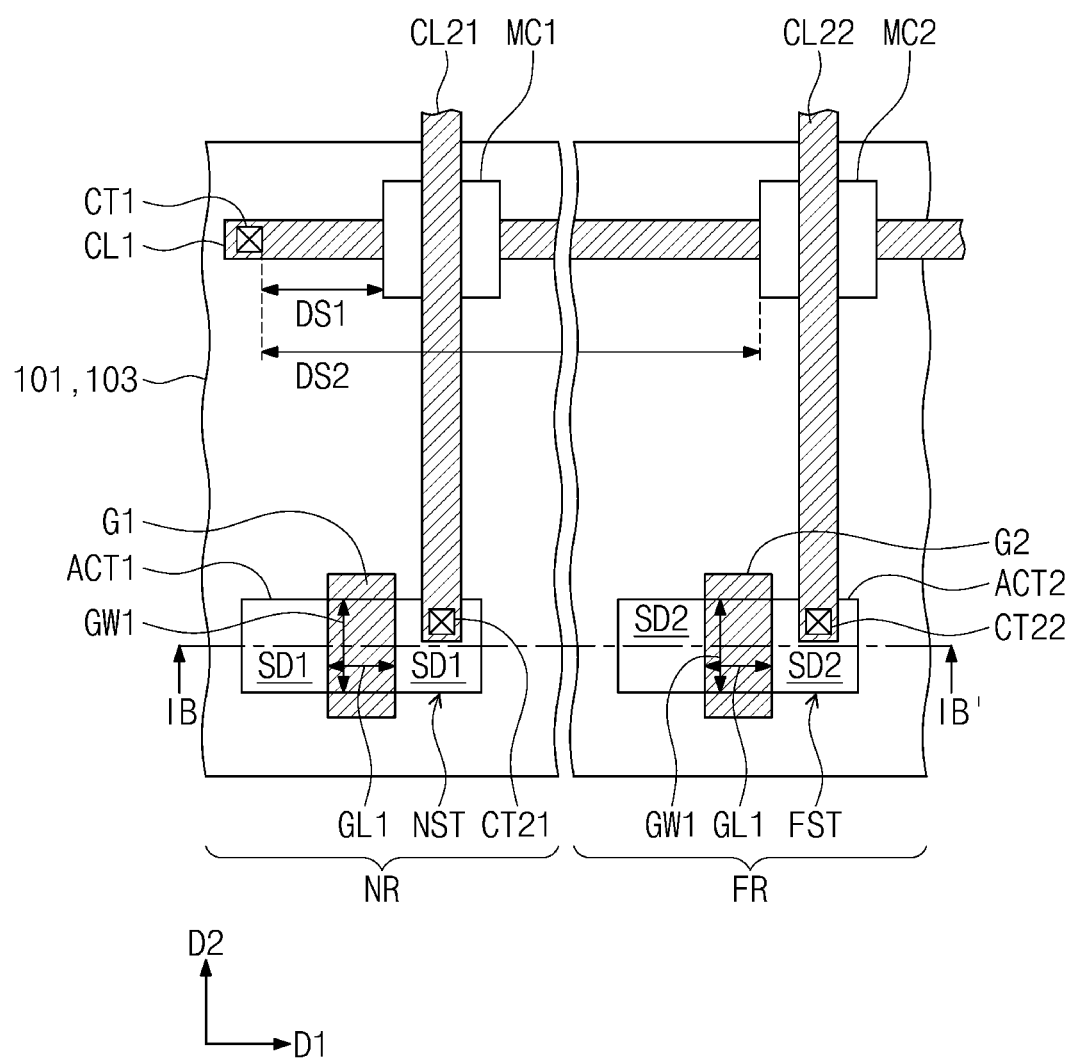
FIG. 4A is a plan view illustrating a semiconductor memory device according to an embodiment of the inventive concept.
Figure 4B:
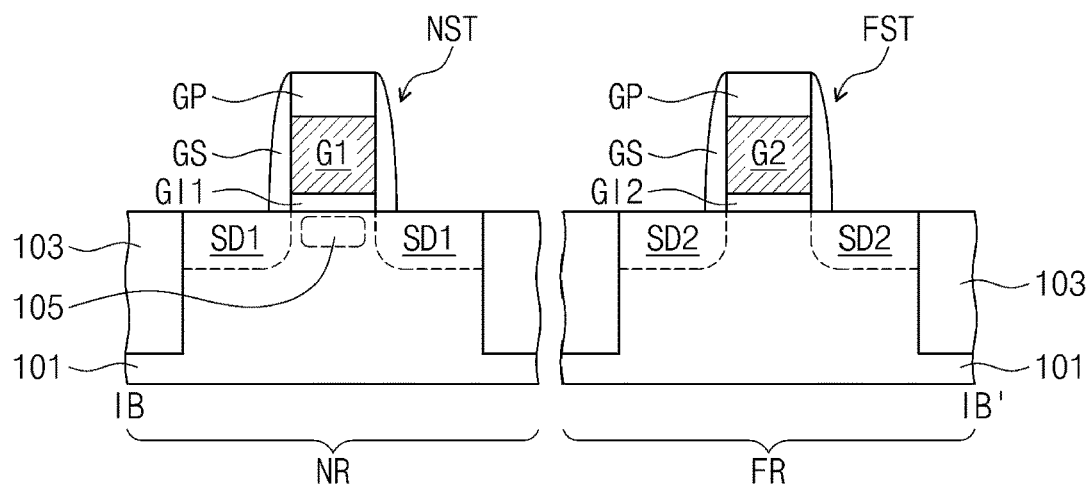
FIG. 4B is a sectional view taken along a line IB-IB' of FIG. 4A.
Figure 4C:
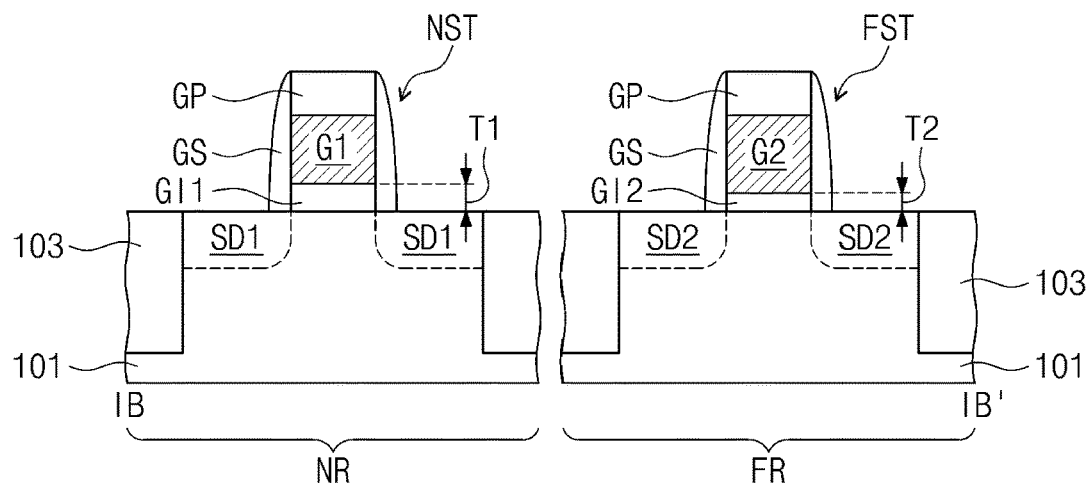
FIG. 4C is a sectional view taken along the line IB-IB' of FIG. 4A.

FIG. 4A is a plan view illustrating a semiconductor memory device according to an embodiment of the inventive concept. FIG. 4B is a sectional view taken along a line IB-IB' of FIG. 4A. FIG. 4C is a sectional view taken along the line IB-IB' of FIG. 4A.

Referring to FIGS. 4A and 4B, the semiconductor memory device according to the present embodiment may include a substrate 101, a first conductive line CL1, which is provided on the substrate 101 to extend in the first direction D1, and a 21-th conductive line CL21 and a 22-th conductive line CL22, which are provided on the substrate 101 to extend in the second direction D2 or to cross the first conductive line CL1. A first memory cell MC1 may be disposed between the first conductive line CL1 and the 21-th conductive line CL21 or at an intersection therebetween. A second memory cell MC2 may be disposed between the first conductive line CL1 and the 22-th conductive line CL22 or at an intersection therebetween. An end portion of the first conductive line CL1 may be connected to a transistor, which is used to select the first conductive line CL1, through a first contact CT1. The first memory cell MC1 may be spaced apart from the first contact CT1 by a first distance DS1, and the second memory cell MC2 may be spaced apart from the first contact CT1 by a second distance DS2. The second distance DS2 may be greater than the first distance DS1. When classified based on the distance from the first contact CT1, the first memory cell MC1 may correspond to the near memory cell, and the second memory cell MC2 may correspond to the far memory cell. The 21-th conductive line CL21 may be connected to a near selection transistor NST through the first bit line connection contact CT21. The 22-th conductive line CL22 may be connected to a far selection transistor FST through the second bit line connection contact CT22. The substrate 101 may include a near selection region NR and a far selection region FR. The near selection transistor NST may be disposed in the near selection region NR, and the far selection transistor FST may be disposed in the far selection region FR.

For example, the first conductive line CL1 may correspond to one of the sub-word lines SWL1 to SWL4 of FIG. 3. The 21-th conductive line CL21 may correspond to one of the first and second local bit lines LBL1 and LBL2 of FIG. 3. The 22-th conductive line CL22 may correspond to one of the third and fourth local bit lines LBL3 and LBL4 of FIG. 3. The near selection transistor NST may correspond to the one of the first and second bit line selection transistors BST1 and BST2 of FIG. 3. The far selection transistor FST may correspond to one of the third and fourth bit line selection transistors BST3 and BST4 of FIG. 3.

As another example, the first conductive line CL1 may correspond to one of the local bit lines LBL1 to LBL4 of FIG. 3. The 21-th conductive line CL21 may correspond to one of the first and second sub-word lines SWL1 and SWL2 of FIG. 3. The 22-th conductive line CL22 may correspond to one of the third and fourth sub-word lines SWL3 and SWL4 of FIG. 3. The near selection transistor NST may correspond to one of the first and second word line selection transistors WST1 and WST2 of FIG. 3. The far selection transistor FST may correspond to one of the third and fourth word line selection transistors WST3 and WST4 of FIG. 3.

A device isolation layer 103 may be disposed in the substrate 101 to delimit active regions ACT1 and ACT2 for the selection transistors NST and FST. The near selection transistor NST may include a first gate electrode G1 disposed on the substrate 101, a first gate insulating layer GI1 between the first gate electrode G1 and the substrate 101, and first source/drain regions SD1 provided in two portions of the substrate 101 at both sides of the first gate electrode G1. The far selection transistor FST may include a second gate electrode G2 disposed on the substrate 101, a second gate insulating layer GI2 between the second gate electrode G2 and the substrate 101, and second source/drain regions SD2 provided in two portions of the substrate 101 at both sides of the second gate electrode G2. Each of the selection transistors NST and FST may further include a gate spacer GS covering a side surface of the gate electrode G1 or G2 and a gate capping pattern GP disposed on the gate electrode G1 or G2. The selection transistors NST and FST may have substantially the same gate width GW1. The selection transistors NST and FST may have substantially the same gate length GL1.

The substrate 101 may be doped with a first impurity of a first conductivity type. The source/drain regions SD1 and SD2 may be doped with a second impurity of a second conductivity type different from the first conductivity type. A doping concentration of the first impurity in the substrate 101 below the first gate electrode G1 of the near selection transistor NST may be higher than that below the second gate electrode G2 of the far selection transistor FST. Alternatively, a barrier region 105 may be further provided in a portion of the substrate 101 that is located below the first gate electrode G1 of the near selection transistor NST. The barrier region 105 may be doped with the first impurity of the first conductivity type. However, the doping concentration of the first impurity in the barrier region 105 may be higher than the doping concentration of the first impurity in the substrate 101.

Alternatively, referring to FIG. 4C, a first thickness T1 of the first gate insulating layer GI1 may be larger than a second thickness T2 of the second gate insulating layer GI2. Due to the difference in doping concentration or the difference in thickness of the gate insulating layer, the threshold voltage of the near selection transistor NST may be higher than the threshold voltage of the far selection transistor FST.

Figure 5A:
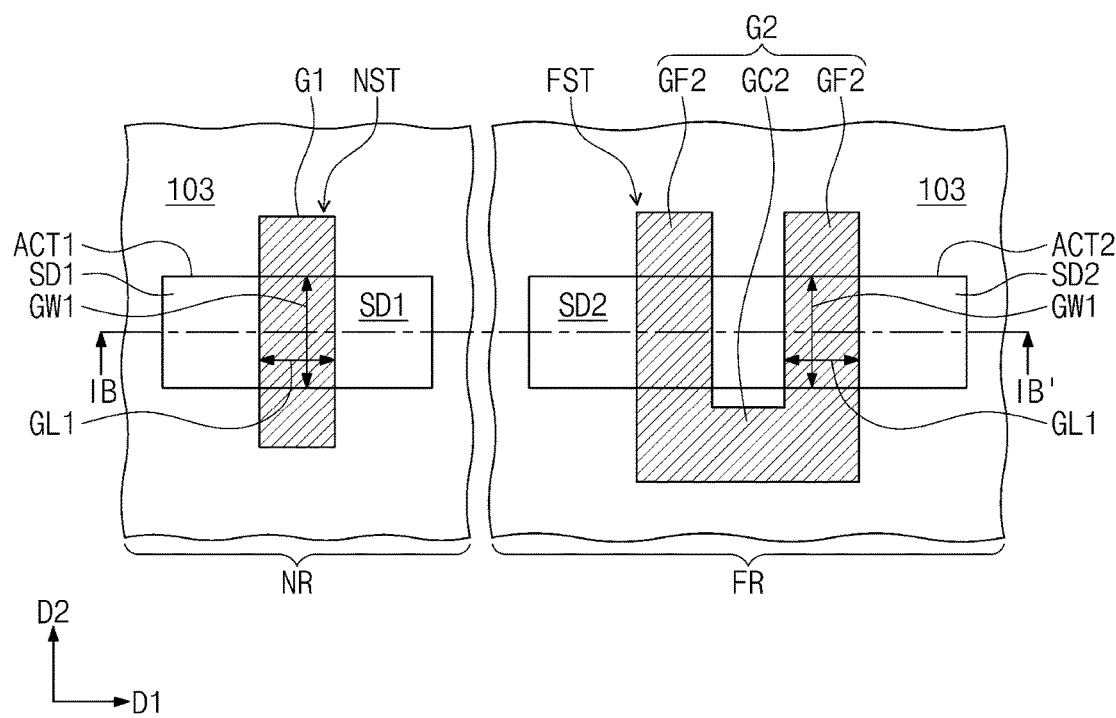
FIG. 5A is a plan view illustrating a semiconductor memory device according to an embodiment of the inventive concept.
Figure 5B:
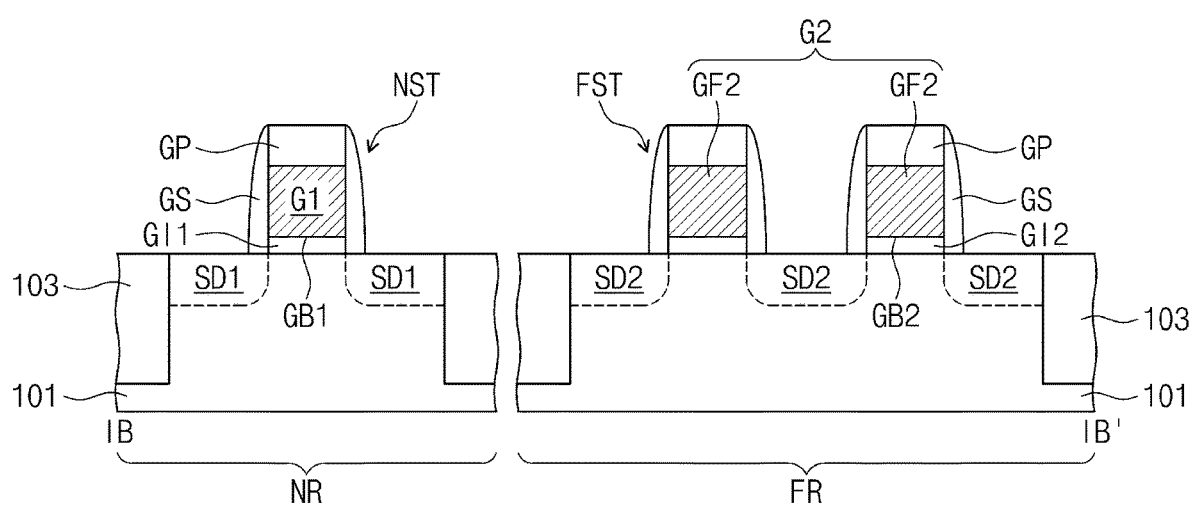
FIG. 5B is a sectional view taken along a line IB-IB' of FIG. 5A.

FIG. 5A is a plan view illustrating a semiconductor memory device according to an embodiment of the inventive concept. FIG. 5B is a sectional view taken along a line IB-IB' of FIG. 5A.

Referring to FIGS. 5A and 5B, the semiconductor memory device according to the present embodiment may include the substrate 101 and the selection transistors NST and FST disposed thereon. In the present embodiment, an effective gate width of the far selection transistor FST may be larger than an effective gate width of the near selection transistor NST. In this case, an amount of current transferred through the far selection transistor FST may be larger than an amount of current transferred through the near selection transistor NST. An effective gate width of each transistor may correspond to a length of a bottom surface of the gate electrode, which overlaps the substrate or the active region in a length direction of the gate electrode (or in a direction parallel to a top surface of the substrate between source/drain regions). In the present embodiment, the near selection transistor NST may not include the barrier region 105.

In FIG. 4A, it is illustrated that the first gate electrode G1 crosses over the first active region ACT1 in the second direction D2 and the second gate electrode G2 crosses over the second active region ACT2 in the second direction D2. However, the directions in which the gate electrodes G1 and G2 cross over the active regions ACT1 and ACT2 are not limited to the second direction D2. For example, the first gate electrode G1 may cross over the first active region ACT1 in a third direction and the second gate electrode G2 may cross over the second active region ACT2 in a fourth direction. Each of the third direction and the fourth direction may independently be the same as or different from the first direction D1 or the second direction D2. The third direction and the fourth direction may be parallel to a top surface of the substrate 101. The third direction may be the same as or different from the fourth direction. However, for the high integration degree, it is preferable that the third direction is the same as the fourth direction.

In the present embodiment, the near selection transistor NST may be the same as that described with reference to FIGS. 4A and 4B. The first gate electrode G1 of the near selection transistor NST may have the shape of a letter 'I', when viewed in a plan view. The second gate electrode G2 of the far selection transistor FST may include two second gate finger portions GF2, which are provided to cross the second active region ACT2 and are spaced apart from each other, and a second gate connecting portion GC2, which is provided to connect the second gate finger portions GF2. The second gate electrode G2 may have the shape of a letter 'U', when viewed in a plan view.

In the present embodiment, the gate width GW1 and the gate length GL1 of the far selection transistor FST, which may be planar gate width and planar gate length in an area of each of the second gate finger portions GF2 overlapping the active region ACT2, may be equal to the gate width GW1 and the gate length GL1 of the near selection transistor NST. The effective gate width of the near selection transistor NST may correspond to a length of a bottom surface GB1 of the first gate electrode G1 in the direction D2, which overlaps the first active region ACT1 between the first source/drain regions SD1, and may be equal to the first gate width GW1. The effective gate width of the far selection transistor FST may be equal to a value obtained by multiplying the number of the second gate finger portions GF2 by a length GW1 of a bottom surface GB2 of one of the second gate finger portions GF2 overlapping the second active region ACT2 in the direction D2 between the second source/drain regions SD2. Since the second gate electrode G2 has two second gate finger portions GF2, the effective gate width of the far selection transistor FST may be two times the gate width GW1 of the near selection transistor NST. Accordingly, an amount of current transferred through the far selection transistor FST may be about two times an amount of current transferred through the near selection transistor NST.

Figure 6A:
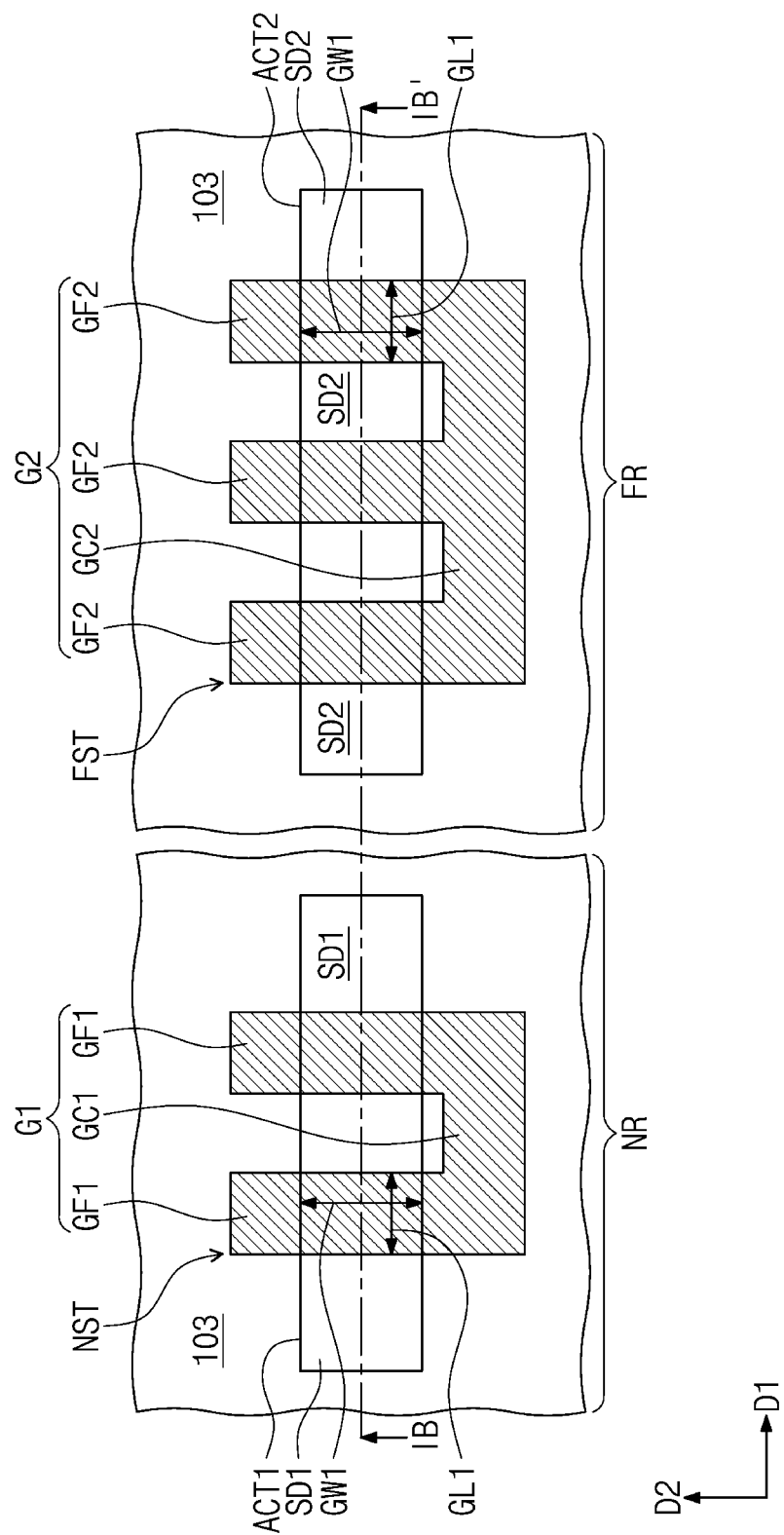
FIG. 6A is a plan view illustrating a semiconductor memory device according to an embodiment of the inventive concept.
Figure 6B:
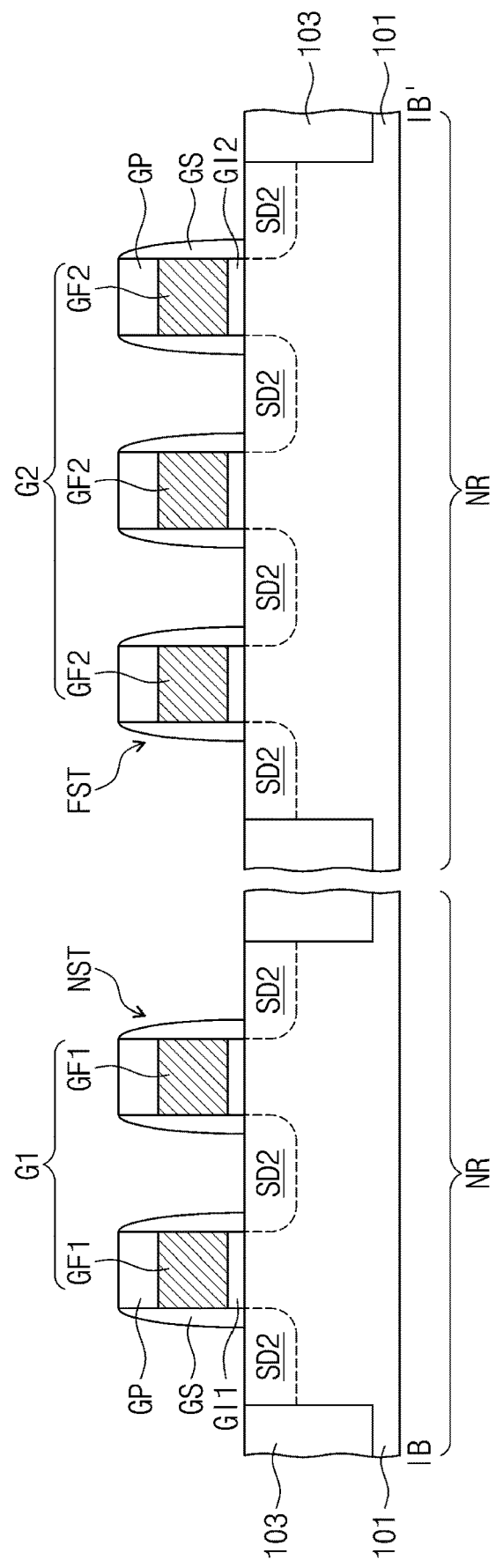
FIG. 6B is a sectional view taken along a line IB-IB' of FIG. 6A.

FIG. 6A is a plan view illustrating a semiconductor memory device according to an embodiment of the inventive concept. FIG. 6B is a sectional view taken along a line IB-IB' of FIG. 6A.

Referring to FIGS. 6A and 6B, in the semiconductor memory device according to the present embodiment, the first gate electrode G1 of the near selection transistor NST may include two first gate finger portions GF1, which are spaced apart from each other and are provided to cross the first active region ACT1, and a first gate connecting portion GC1, which is provided to connect them. When viewed in a plan view, the first gate electrode G1 may have the shape of a letter 'U'. The second gate electrode G2 of the far selection transistor FST may include three second gate finger portions GF2, which are spaced apart from each other and are provided to cross the second active region ACT2, and a second gate connecting portion GC2, which is provided to connect them. When viewed in a plan view, the second gate electrode G2 may have the shape of a letter 'III'. If the gate finger portions GF1 and GF2 are assumed to be the same as each other in terms of their gate width and gate length (e.g., GW1 and GL1), the effective gate width of the far selection transistor FST may be about 1.5 times that of the near selection transistor NST. Accordingly, an amount of current transferred through the far selection transistor FST may be about 1.5 times an amount of current transferred through the near selection transistor NST. Except for this difference, the semiconductor memory device may be configured to have substantially the same features as those described with reference to FIGS. 5A and 5B.

In an embodiment, the gate finger number of the near selection transistor NST may be three or more. The gate finger number of the far selection transistor FST may be four or more, and in this case, the gate electrode of the far selection transistor FST may be shaped like a comb, when viewed in a plan view. In an embodiment, the far selection transistor FST may be configured to have the gate finger number that is greater than the gate finger number of the near selection transistor NST. Thus, the effective gate width of the far selection transistor FST may be relatively larger than that of the near selection transistor NST, and in this case, it may be possible to maintain an amount of current, which can be transferred through the far selection transistor FST, to a value greater than that through the near selection transistor NST.

Figure 7A:
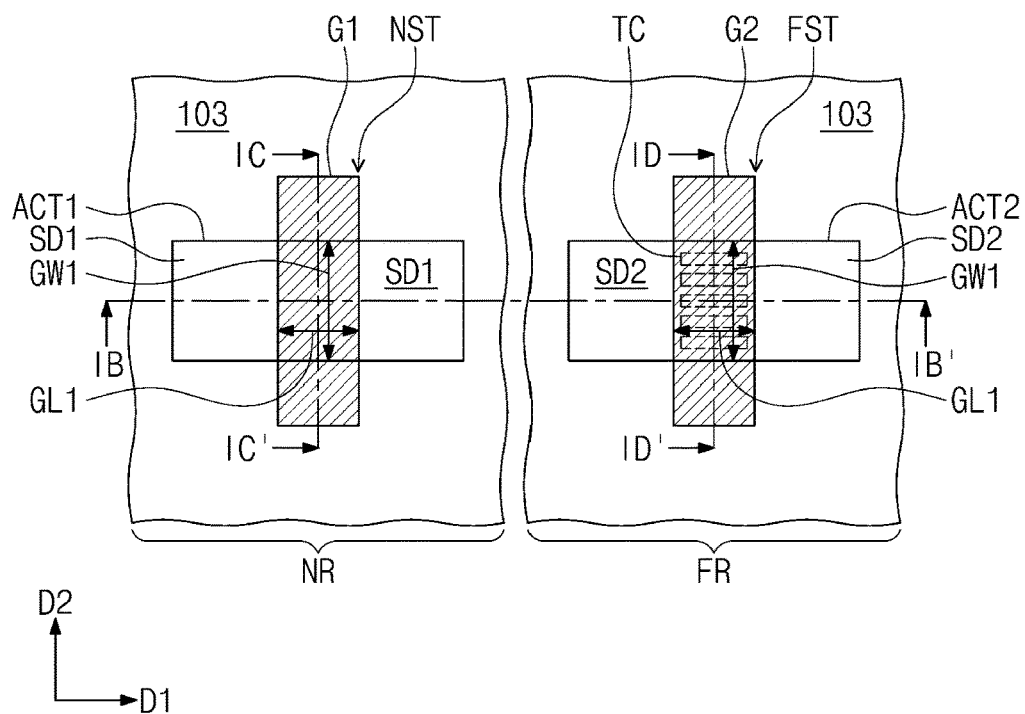
FIG. 7A is a plan view illustrating a semiconductor memory device according to an embodiment of the inventive concept.
Figure 7B:
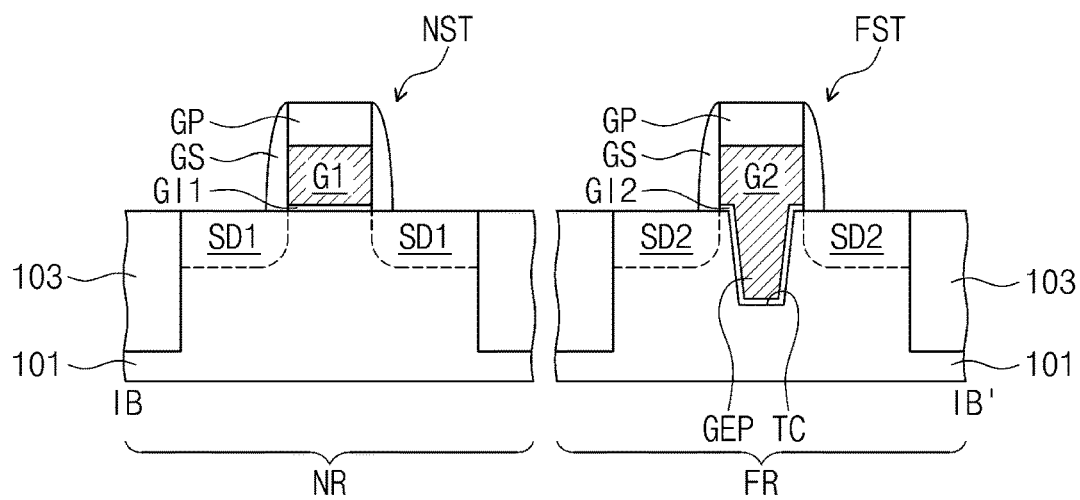
FIG. 7B is a sectional view taken along a line IB-IB' of FIG. 7A.
Figure 7C:
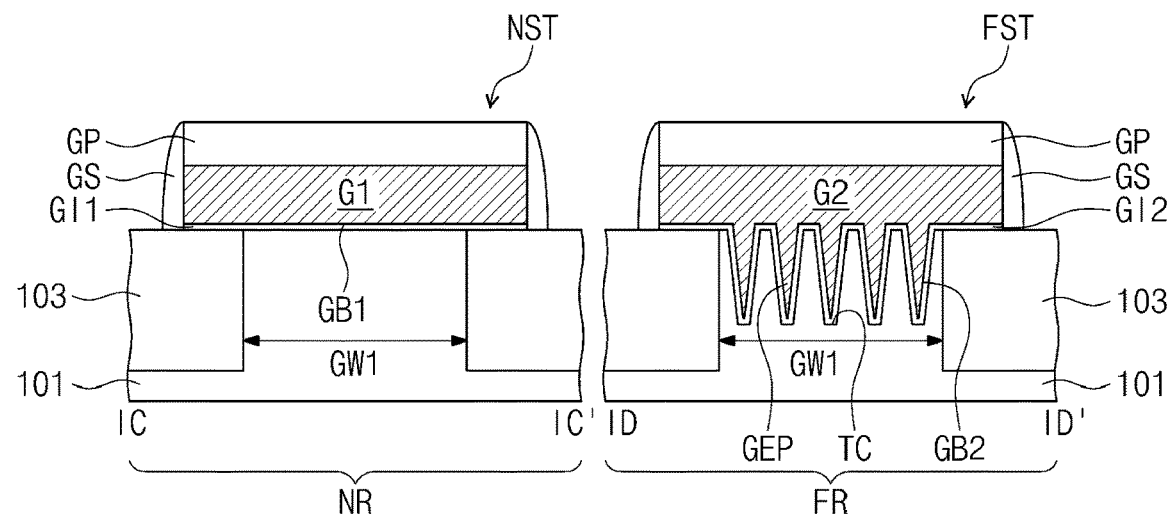
FIG. 7C is a sectional view taken along lines IC-IC' and ID-ID' of FIG. 7A.

FIG. 7A is a plan view illustrating a semiconductor memory device according to an embodiment of the inventive concept. FIG. 7B is a sectional view taken along a line IB-IB' of FIG. 7A. FIG. 7C is a sectional view taken along lines IC-IC' and ID-ID' of FIG. 7A.

Referring to FIGS. 7A to 7C, in the present embodiment, the near selection transistor NST may be the same as that described with reference to FIGS. 4A and 4B. A plurality of trenches TC may be formed in the substrate 101 below the second gate electrode G2 of the far selection transistor FST. The trenches TC may be spaced apart from each other in a second direction D2 or in the width direction of the second gate electrode G2. In this case, the second gate insulating layer GI2 may be formed to conformally cover bottom and inner side surfaces of the trenches TC or to have a constant thickness regardless of position. In addition, some portions of the second gate electrode G2 may be inserted into the trenches TC. For example, the second gate electrode G2 may have a plurality of gate protruding portions GEP, which are inserted into the substrate 101.

In the present embodiment, the effective gate width of the near selection transistor NST may correspond to a length of a bottom surface GB1 of the first gate electrode G1, in the direction D2, which overlaps the first active region ACT1 between the first source/drain regions SD1, and may be equal to the first gate width GW1. Since, due to the gate protruding portions GEP, the bottom surface GB2 of the second gate electrode G2 has an uneven shape, the effective gate width of the far selection transistor FST may correspond to a length of the bottom surface GB2 of the second gate electrode G2 in the direction D2, which overlaps the second active region ACT2 between the second source/drain regions SD2, and may be larger than the first gate width GW1.

Accordingly, the effective gate width of the far selection transistor FST may be larger than the effective gate width of the near selection transistor NST.

Figure 7D:
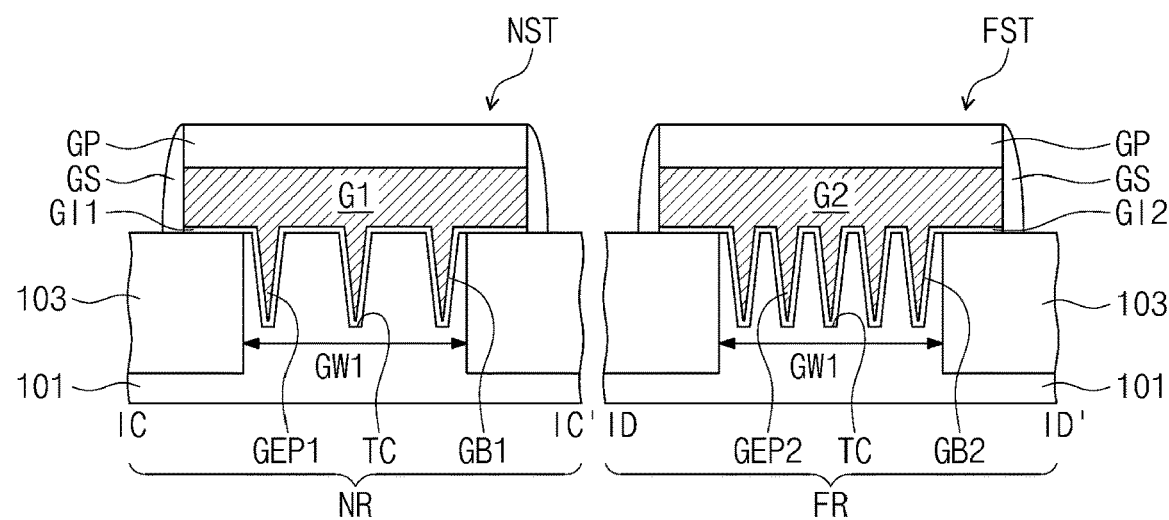
FIG. 7D is a sectional view taken along the lines IC-IC' and ID-ID' of FIG. 7A.

FIG. 7D is a sectional view taken along the lines IC-IC' and ID-ID' of FIG. 7A.

Referring to FIG. 7D, the first gate electrode G1 of the near selection transistor NST may have at least one first gate protruding portion GEP1, which is inserted into the substrate 101. The second gate electrode G2 of the far selection transistor FST may have a plurality of second gate protruding portions GEP2, which are inserted into the substrate 101. The width and depth of the first gate protruding portion GEP1 may be equal to those of the second gate protruding portion GEP2. In an embodiment, the number of the first gate protruding portions GEP1 may be less than the number of the second gate protruding portions GEP2. Thus, the effective gate width of the near selection transistor NST may be smaller than the effective gate width of the far selection transistor FST.

Figure 8:
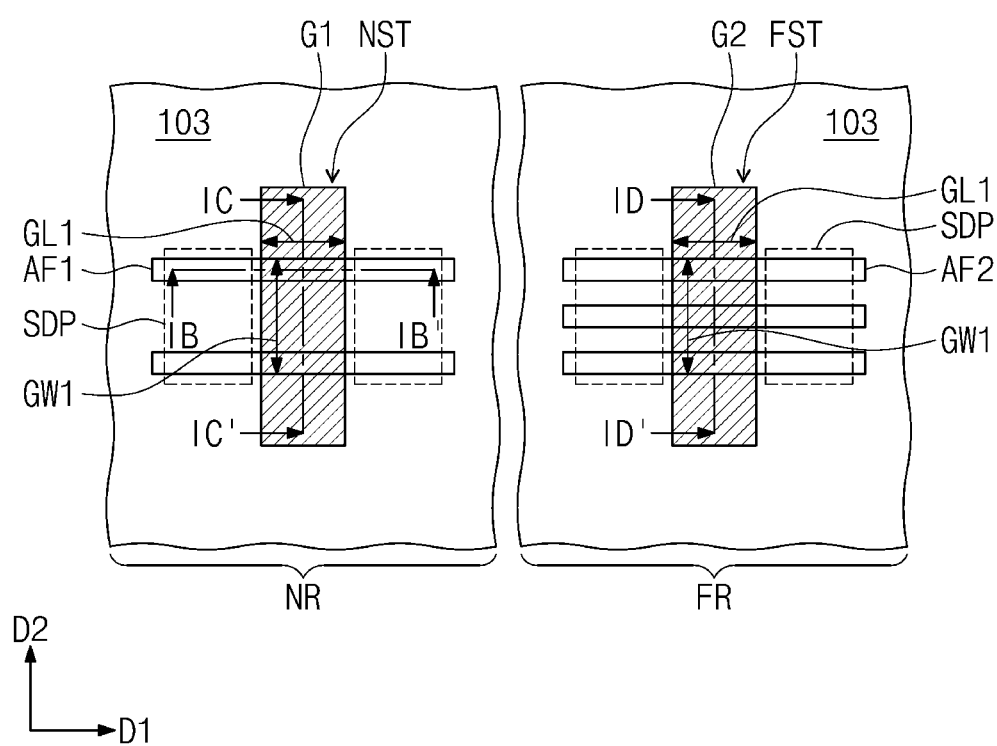
FIG. 8 is a plan view illustrating a semiconductor memory device according to an embodiment of the inventive concept.
Figure 9A:
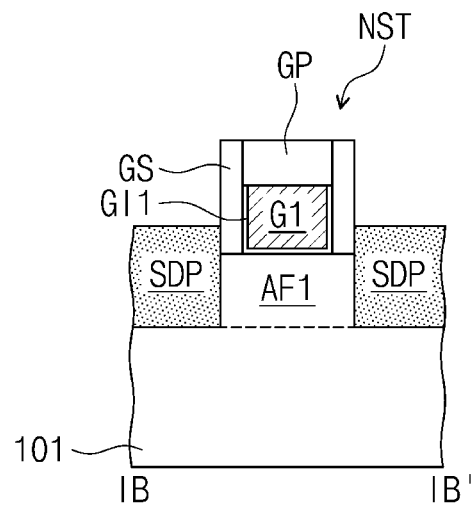
FIG. 9A is a sectional view taken along a line IB-IB' of FIG. 8.
Figure 9B:
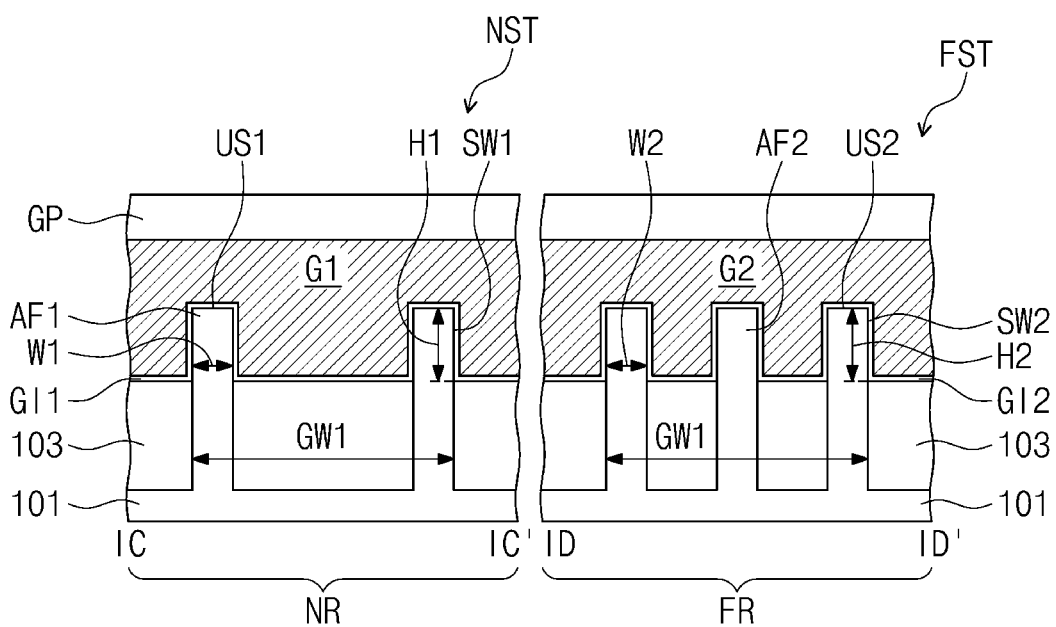
FIG. 9B is a sectional view taken along lines IC-IC' and ID-ID' of FIG. 8.

FIG. 8 is a plan view illustrating a semiconductor memory device according to an embodiment of the inventive concept. FIG. 9A is a sectional view taken along a line IB-IB' of FIG. 8. FIG. 9B is a sectional view taken along lines IC-IC' and ID-ID' of FIG. 8.

Referring to FIGS. 8, 9A, and 9B, the near selection transistor NST may include first active fins AF1, which are portions of the substrate 101 or are epitaxially grown on the substrate 101 provided below the first gate electrode G1 and protrude toward the first gate electrode G1. Source/drain patterns SDP may be disposed at opposite sides of the first gate electrode G1. The first gate insulating layer GI1 may be interposed between the first gate electrode G1 and the first active fin AF1 and between the first gate electrode G1 and the gate spacer GS. The near selection transistor NST may have a fin field effect transistor (FinFET) structure. Similarly, the far selection transistor FST may also have the FinFET structure. That is, the far selection transistor FST may include second active fins AF2, which are portions of the substrate 101 or are epitaxially grown on the substrate 101 provided below the second gate electrode G2 and protrude toward the second gate electrode G2.

In FIG. 9B, the gate width GW1 of a portion of the first gate electrode G1 that covers the first active fins AF1 for the near selection transistor NST may correspond to a distance from a side surface of the leftmost one of the first active fins AF1 to an opposite side surface of the rightmost one of the first active fins AF1. Similarly, the gate width GW1 of a portion of the second gate electrode G2 that covers the second active fins AF2 of the far selection transistor FST may correspond to a distance from a side surface of the leftmost one of the second active fins AF2 to an opposite side surface of the rightmost one of the second active fins AF2.

However, the effective gate width of the near selection transistor NST may be given by a formula of $n \times (2 \times H1 + W1)$, where H1 is a length of a side surface SW1 of the first active fin AF1 protruding above the device isolation layer 103 (i.e., a height of the first active fin AF1), W1 is a length of a top surface US1 of the first active fin AF1 (i.e., a width of the first active fin AF1), and n is the number of the first active fins AF1. The effective gate width of the far selection transistor FST may be given by a formula of $m \times (2 \times H2 + W2)$, where H2 is a length of a side surface SW2 of the second active fin AF2 protruding above the device isolation layer 103 (i.e., a height of the second active fin AF2), W2 is a length of a top surface US2 of the second active fin AF2 (i.e., a width of the second active fin AF2), and m is the number of the second active fins AF2. Spatially relative terms, such as "beneath," "below," "lower," "above," "upper" and the like, may be used herein for ease of description to describe positional relationships, such as illustrated in the figures. It will be understood that the spatially relative terms encompass different orientations of the device in addition to the orientation depicted in the figures.

The effective gate width for a gate electrode disposed on an active portion, as viewed in a cross-sectional view, can also be described as a length along a surface of the active portion (in the case of FIGS. 8, 9A, and 9B, the active fins) where the gate electrode conformally covers the active portion. This may be referred to herein as an "active portion surface-covering length" of the gate electrode. Similarly, when considering a three-dimensional view (e.g., not simply a cross-sectional view), a gate electrode may be described as having an effective gate area, which can be described as an area along a surface of the active portion (in the case of FIGS. 8, 9A, and 9B, the active fins) where the gate electrode conformally covers the active portion. This may be referred to herein as an active portion surface-covering area of the gate electrode.

If the selection transistors NST and FST have the same gate width GW1, the heights H1 and H2 of the active fins AF1 and AF2 are the same, and the widths W1 and W2 are the same, the number of the second active fins AF2 of the far selection transistor FST may be greater than the number of the first active fins AF1 of the near selection transistor NST, so that the effective gate width of the far selection transistor FST may be larger than the effective gate width of the near selection transistor NST, and thus, the far selection transistor FST may have better current driving ability than the near selection transistor NST.

Figure 10A:
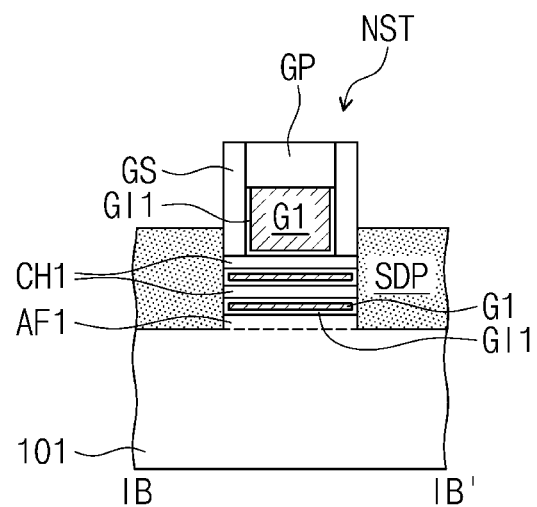
FIG. 10A is a sectional view taken along the line IB-IB' of FIG. 8.
Figure 10B:
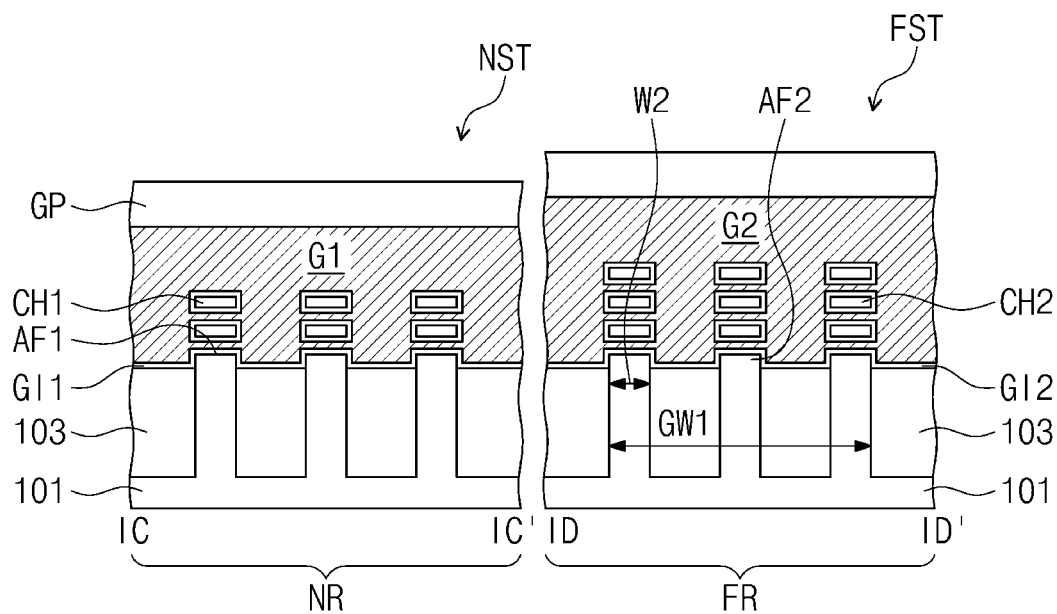
FIG. 10B is a sectional views taken along the lines IC-IC' and ID-ID' of FIG. 8.

FIG. 10A is a sectional view taken along the line IB-IB' of FIG. 8. FIG. 10B illustrate sectional views taken along the lines IC-IC' and ID-ID' of FIG. 8.

Referring to FIGS. 10A and 10B, the near selection transistor NST may further include first channel patterns CH1 formed as part of a stacked structure on the first active fin AF1, and except for this difference, the near selection transistor NST may have a structure similar to that of FIGS. 9A and 9B. In a direction from the first active fin AF1 to the first gate electrode G1, the stacked structure may include a first gate insulating layer GI1, a portion of the first gate electrode G1, a first gate insulating layer GI1, and a first channel pattern CH1. The stacked structure may be repeated and then ended with a first gate insulating layer GI1 in contact with the first gate electrode G1. The near selection transistor NST may have a multi-bridge channel field effect transistor (MBCFET) structure. The far selection transistor FST may also have the MBCFET structure. The far selection transistor FST may further include second channel patterns CH2 stacked on the second active fin AF2, and except for this difference, the far selection transistor FST may have a structure similar to that of FIGS. 9A and 9B. The stacked structure of the far selection transistor may be similar to the stacked structure of the near selection transistor.

The effective gate width of the selection transistor NST or FST may be equal to a sum of the value, which is given for the selection transistor NST or FST in FIGS. 9A and 9B, and circumferential length(s) of the channel pattern(s) CH1 or CH2. If the active fins AF1 and AF2 are the same in terms of their height, width, and number and the channel patterns CH1 and CH2 are the same in terms of their width and thickness, the more the channel patterns CH1 and CH2, the larger the effective gate widths. Thus, in the present embodiment, the number of the second channel patterns CH2 in the far selection transistor FST may be greater than the number of the first channel patterns CH1 in the near selection transistor NST.

The first and second bit line selection transistors BST1 and BST2 and the first and second word line selection transistors WST1 and WST2 of FIG. 3 may each independently have the same structure as one of the near selection transistors NST described with reference to FIGS. 4A to 10B. The third and fourth bit line selection transistors BST3 and BST4 and the third and fourth word line selection transistors WST3 and WST4 of FIG. 3 may each independently have the same structure as one of the far selection transistors FST described with reference to FIGS. 4A to 10B.

Figure 11:
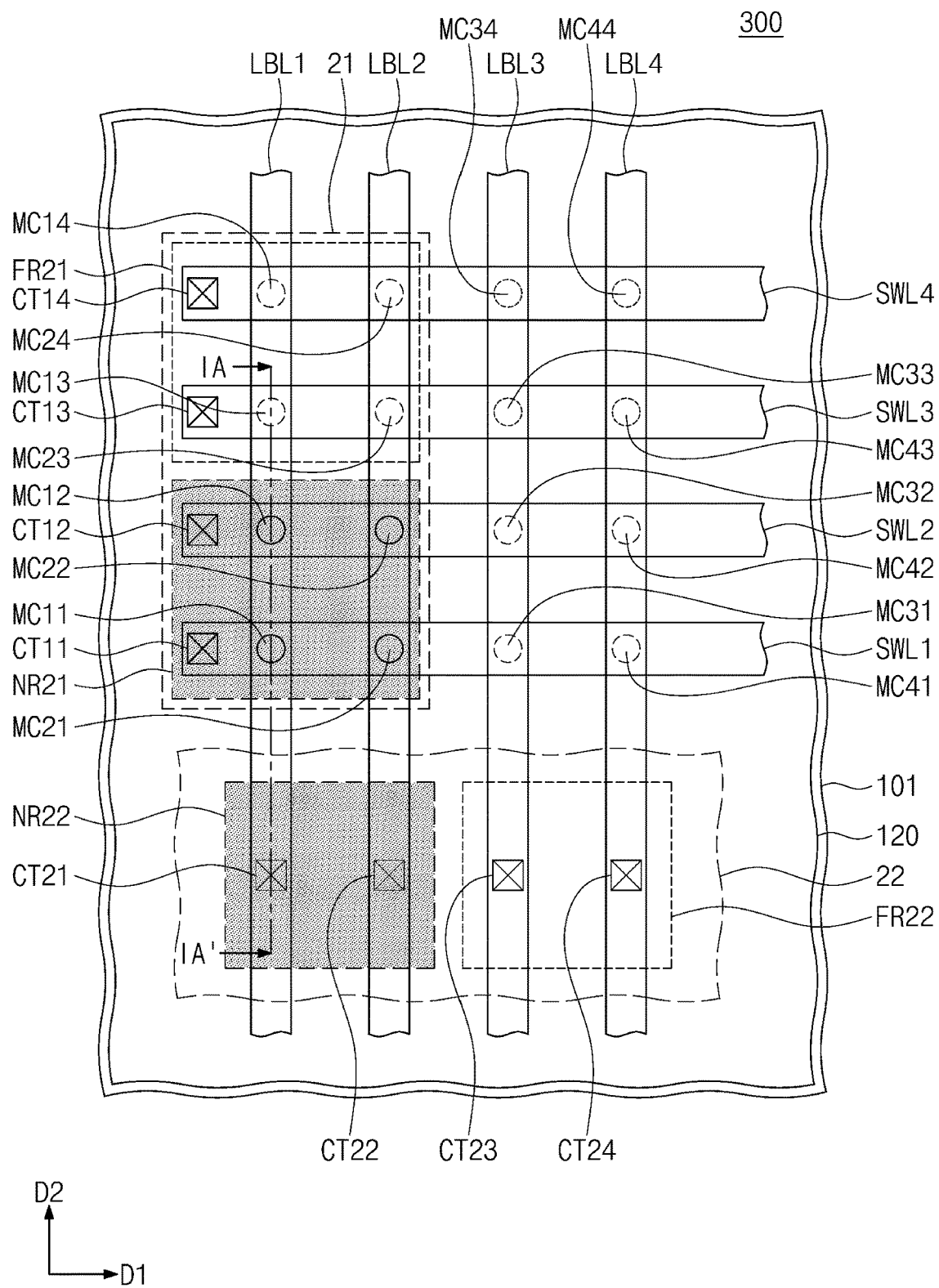
FIG. 11 is a plan view illustrating a semiconductor memory device according to an embodiment of the inventive concept.
Figure 12:
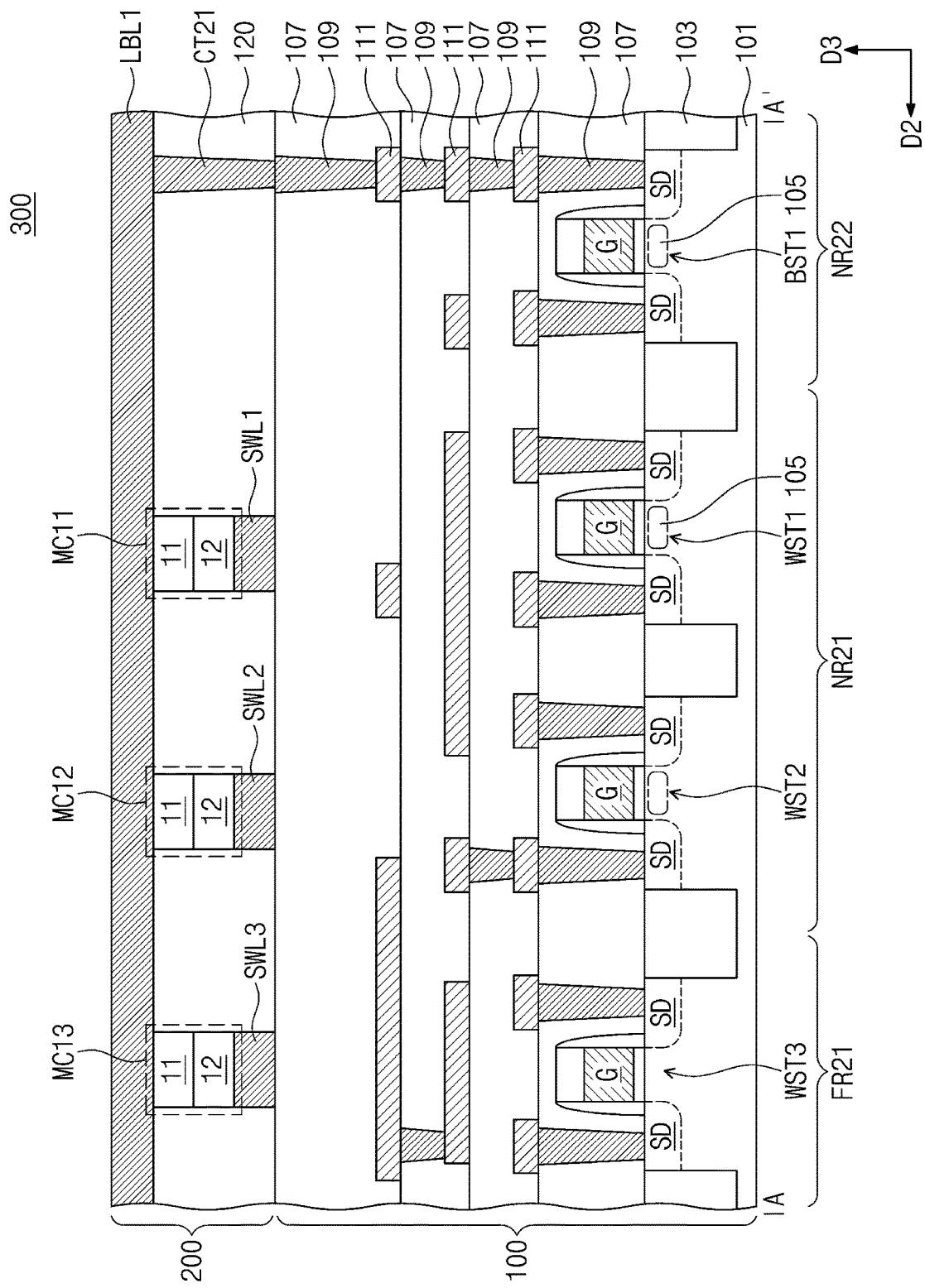
FIG. 12 is a sectional view taken along a line IA-IA' of FIG. 11.
Figure 13:
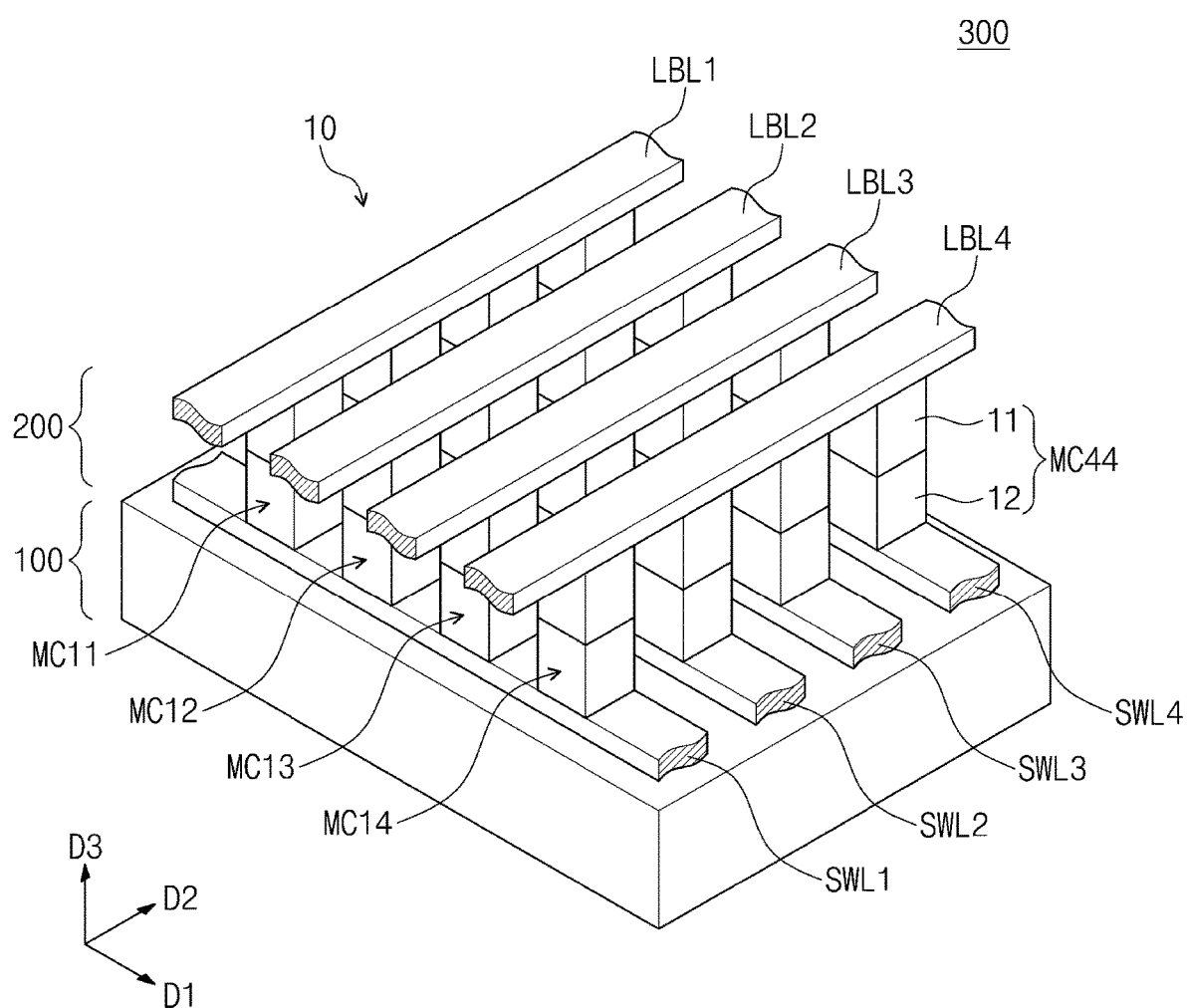
FIG. 13 is a perspective view illustrating a semiconductor memory device according to an embodiment of the inventive concept.

FIG. 11 is a plan view illustrating a semiconductor memory device according to an embodiment of the inventive concept. FIG. 12 is a sectional view taken along a line IA-IA' of FIG. 11. FIG. 13 is a perspective view illustrating a semiconductor memory device according to an embodiment of the inventive concept.

Referring to FIGS. 3 and 11 to 13, in a semiconductor memory device 300 according to the present embodiment, a cell array portion 200 may be disposed on a peripheral circuit portion 100. The peripheral circuit portion 100 may include the peripheral circuit region PERI and the core regions 20 described with reference to FIGS. 1 to 3. Thus, it may be advantageous to increase an integration density of the semiconductor memory device 300.

The cell array portion 200 may include the cell array regions 10 described with reference to FIGS. 1 to 3. FIG. 11 illustrates one core region and a portion of one cell array region 10 disposed thereon. In the present embodiment, the word line driver region 21 may at least partially overlap the sub-word lines SWL1 to SWL4. The bit line selection region 22 may at least partially overlap the local bit lines LBL1 to LBL4.

Although not shown in FIG. 11, the word line selection transistors WST1 to WST4 described with reference to FIG. 3 may be disposed in the word line driver region 21 and may be respectively connected to the sub-word lines SWL1 to SWL4 through the word line connection contacts CT11 to CT14. The bit line selection transistors BST1 to BST4 described with reference to FIG. 3 may be disposed in the bit line selection region 22 and may be respectively connected to the local bit lines LBL1 to LBL4 through the bit line connection contacts CT21 to CT24.

Referring to FIGS. 3, 11, and 12, the word line driver region 21 may include a near word line selection region NR21 and a far word line selection region FR21. The first and second word line selection transistors WST1 and WST2 connected to near memory cells MC11, MC12, MC21, and MC22 may be disposed in the near word line selection region NR21. The near word line selection region NR21 may overlap end portions of the first and second sub-word lines SWL1 and SWL2. The third and fourth word line selection transistors WST3 and WST4 connected to far memory cells MC44, MC34, MC43, and MC33 may be disposed in the far word line selection region FR21. The far word line selection region FR21 may overlap end portions of the third and fourth sub-word lines SWL3 and SWL4.

Similarly, the bit line selection region 22 may include a near bit line selection region NR22 and a far bit line selection region FR22. The first and second bit line selection transistors BST1 and BST2 connected to the near memory cells MC11, MC12, MC21, and MC22 may be disposed in the near bit line selection region NR22. The near bit line selection region NR22 may overlap end portions of the first and second local bit lines LBL1 and LBL2. The third and fourth bit line selection transistors BST3 and BST4 connected to the far memory cells MC44, MC34, MC43, and MC33 may be disposed in the far bit line selection region FR22. The far bit line selection region FR22 may overlap end portions of the third and fourth local bit lines LBL3 and LBL4.

The near bit line selection region NR22 may be disposed adjacent to the near word line selection region NR21 than the far bit line selection region FR22. The far word line selection region FR21 may be spaced apart from the near bit line selection region NR22, in the second direction D2, with the near word line selection region NR21 interposed therebetween. The near bit line selection region NR22 and the far bit line selection region FR22 may be disposed side by side in the first direction D1. The near word line selection region NR21 and the far word line selection region FR21 may be disposed side by side in the second direction D2.

Referring to FIG. 12, the peripheral circuit portion 100 may further include the substrate 101, the device isolation layer 103, selection transistors WST1-WST4 and BST1-BST4, peripheral interlayer insulating layers 107, peripheral contacts 109, and peripheral interconnection lines 111. The substrate 101 may be a semiconductor substrate that is formed of or include a semiconductor material (e.g., silicon). The substrate 101 may be a single-crystalline silicon substrate, a silicon epitaxial layer, or a silicon-on-insulator (SOI) substrate. The device isolation layer 103 may be disposed in the substrate 101 to define active regions for the selection transistors WST1-WST4 and BST1-BST4. The device isolation layer 103 may be formed of or include at least one of silicon oxide or silicon nitride and may have a single- or multi-layered structure. The peripheral interlayer insulating layers 107 may have a single- or multi-layered structure and may be formed of or include at least one of silicon oxide, silicon nitride, silicon oxynitride, porous insulating materials. The peripheral contacts 109 may be provided to penetrate the peripheral interlayer insulating layers 107 and may be connected to the peripheral interconnection lines 111. The peripheral contacts 109 and the peripheral interconnection lines 111 may be formed of or include a metal-containing layer, such as, a tungsten layer, a copper layer, an aluminum layer, a titanium layer, a tantalum layer, a titanium nitride layer, and a tantalum nitride layer.

The cell array portion 200 may further include a cell interlayer insulating layer 120. The cell interlayer insulating layer 120 may be provided to fill regions between the sub-word lines SWL1 to SWL4 and between the memory cells MC11 to MC44. Each of the connection contacts CT11-CT14 and CT21-CT24 may be provided to penetrate the cell interlayer insulating layer 120 and may be connected to a corresponding one of the peripheral contacts 109 or a corresponding one of the peripheral interconnection lines 111.

Each of the selection transistors WST1-WST4 and BST1-BST4 may include a gate electrode G and source/drain regions SD. Each of the first and second word line selection transistors WST1 and WST2 and the first and second bit line selection transistors BST1 and BST2, which are disposed in the near selection regions NR21 and NR22 and are respectively connected to the near memory cells MC11, MC12, MC21, and MC22, may further include the barrier region 105. For example, the first and second word line selection transistors WST1 and WST2 and the first and second bit line selection transistors BST1 and BST2 may have the same shape as the near selection transistor NST described with reference to FIGS. 4A to 10B. The third and fourth word line selection transistors WST3 and WST4 and the third and fourth bit line selection transistors BST3 and BST4, which are disposed in the far selection regions FR21 and FR22 and are respectively connected to the far memory cells MC44, MC34, MC43, and MC33, may not include the barrier region 105. For example, the third and fourth word line selection transistors WST3 and WST4 and the third and fourth bit line selection transistors BST3 and BST4 may have the same shape as the far selection transistor FST described with reference to FIGS. 4A to 10B.

Figure 14:
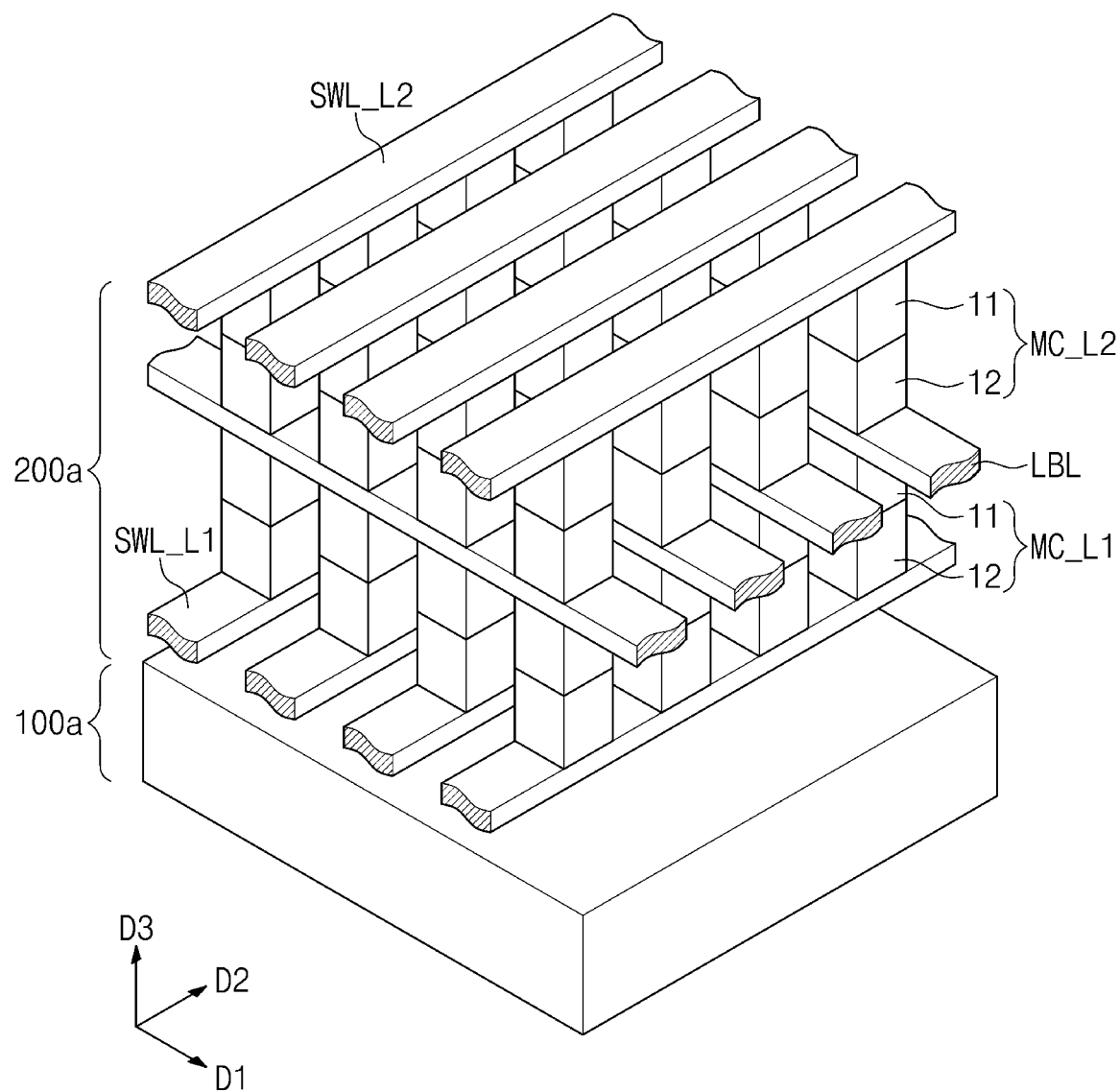
FIG. 14 is a perspective view illustrating a semiconductor memory device according to an embodiment of the inventive concept.
Figure 15:
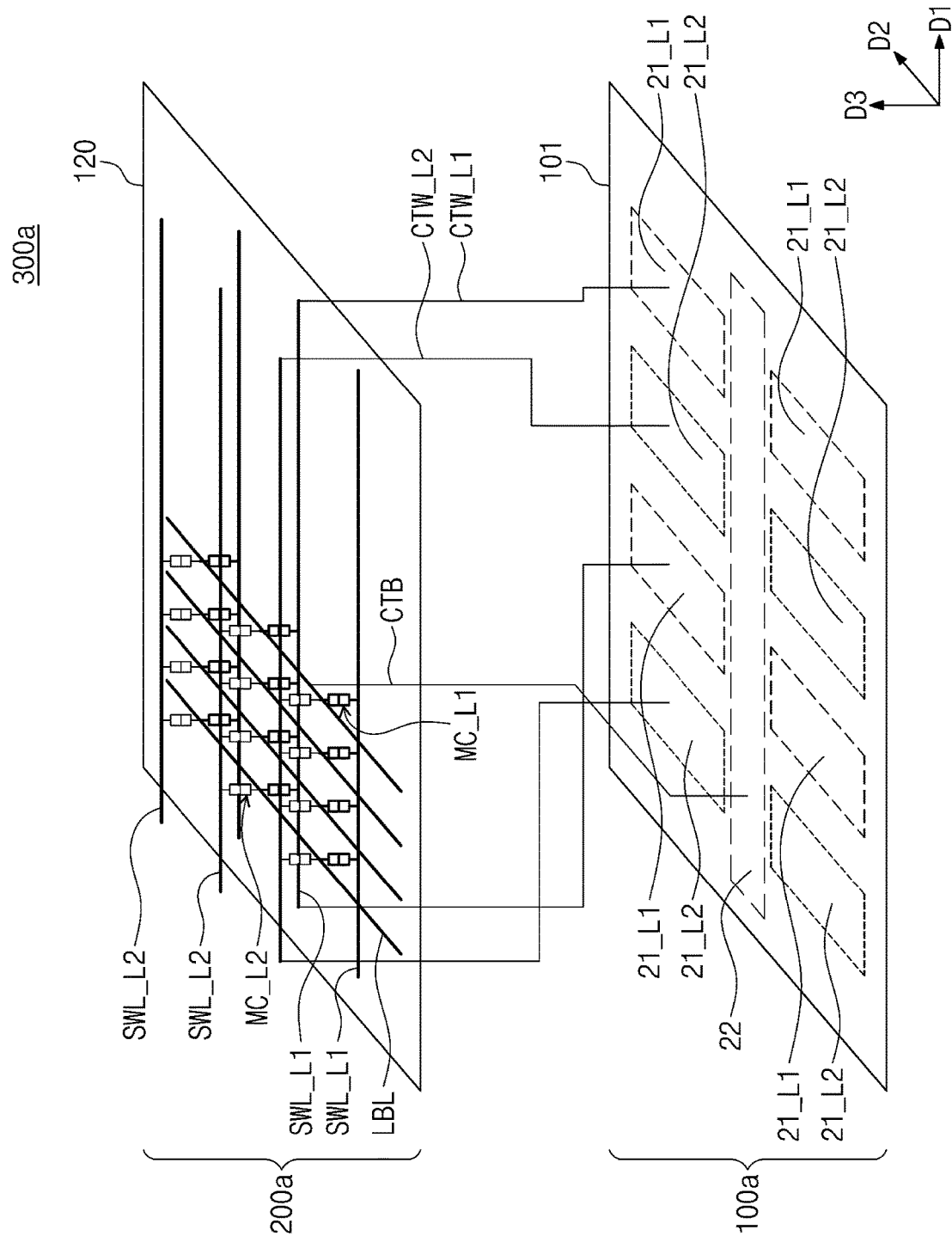
FIG. 15 is a perspective view illustrating a connection structure between a cell array portion and a peripheral circuit portion of FIG. 14.
Figure 16:
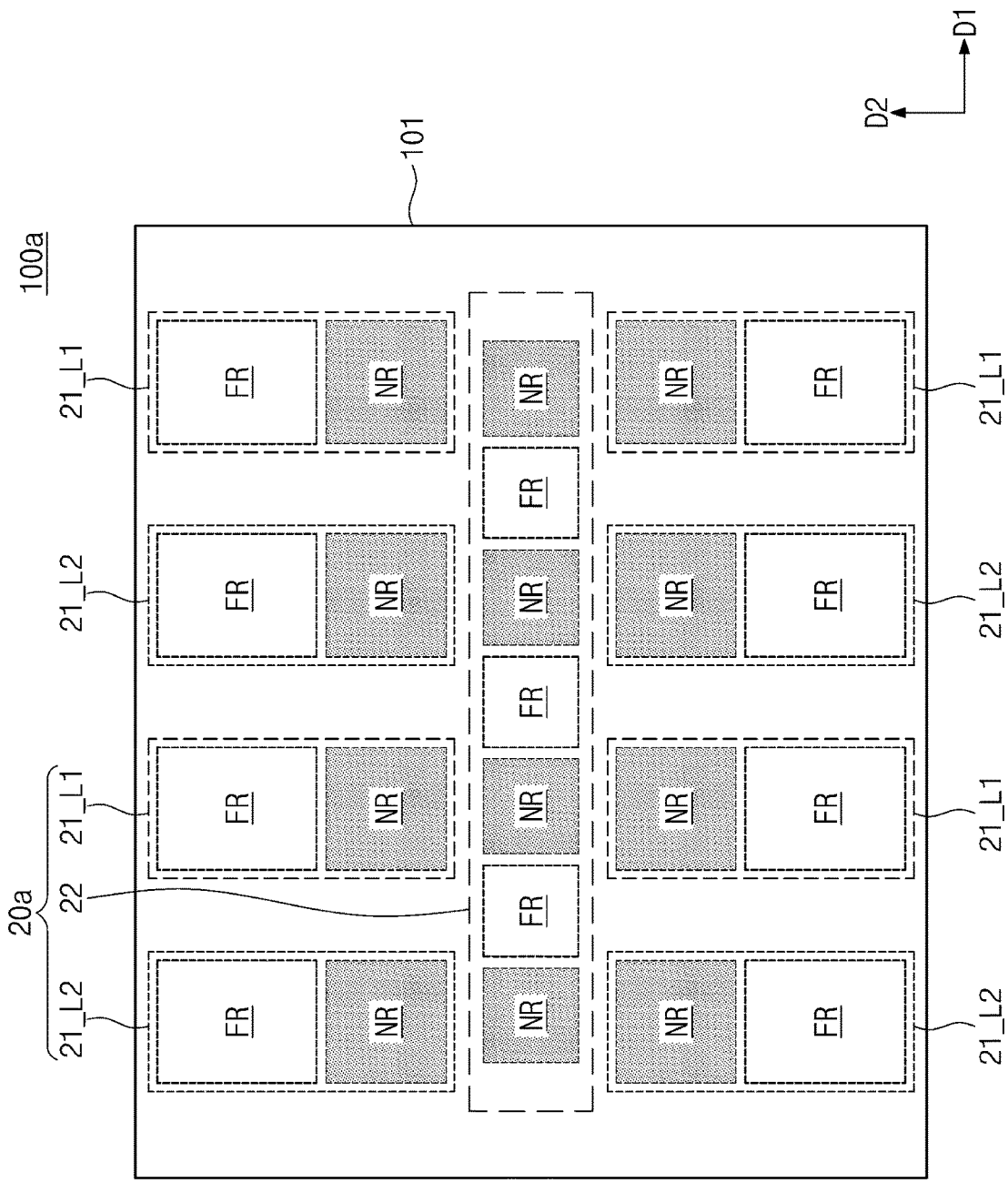
FIG. 16 is a plan view illustrating the peripheral circuit portion of FIG. 15.

FIG. 14 is a perspective view illustrating a semiconductor memory device according to an embodiment of the inventive concept. FIG. 15 is a perspective view illustrating a connection structure between a cell array portion and a peripheral circuit portion of FIG. 14. FIG. 16 is a plan view illustrating the peripheral circuit portion of FIG. 15.

Referring to FIGS. 14 to 16, in a semiconductor memory device 300a according to the present embodiment, a cell array portion 200a may be disposed on a peripheral circuit portion 100a. The cell array portion 200a may include first-level sub-word lines SWL_L1, first-level memory cells MC_L1, the local bit lines LBL, second-level memory cells MC_L2, and second-level sub-word lines SWL_L2, which are sequentially stacked. A core region 20a may be disposed in the peripheral circuit portion 100a. The core region 20a may include the bit line selection region 22, a first-level word line driver region 21_L1, and a second-level word line driver region 21_L2. The bit line selection region 22 may be elongated in the first direction D1 and may cross the local bit lines LBL. In an embodiment, a plurality of the first-level word line driver regions 21_L1 and a plurality of the second-level word line driver regions 21_L2 may be provided at both sides the bit line selection region 22. A pair of first-level word line driver regions 21_L1 and a pair of second-level word line driver regions 21_L2 may be arranged such that they are alternately disposed along each side of the bit line selection region 22. Opposite end portions of each of the first-level sub-word lines SWL_L1 may be respectively connected to the first-level word line driver regions 21_L1 through first-level word line connection contacts CTW_L1. Opposite end portions of each of the second-level sub-word lines SWL_L2 may be respectively connected to the second-level word line driver regions 21_L2 through second-level word line connection contacts CTW_L2. An intermediate portion of the local bit line LBL may be connected to the bit line selection region 22 through a bit line connection contact CTB.

The near selection region NR and the far selection region FR may be disposed in each of the first-level word line driver region 21_L1, the second-level word line driver region 21_L2, and the bit line selection region 22. Near selection transistors, which are used to apply a voltage to the near memory cells in the first-level memory cells MC_L1, may be disposed in the near selection region NR of the first-level word line driver region 21_L1 and the near selection region NR of the bit line selection region 22 adjacent thereto. Far selection transistors, which are used to apply a voltage to the far memory cells in the first-level memory cells MC_L1, may be disposed in the far selection region FR of the first-level word line driver region 21_L1 and the far selection region FR of the bit line selection region 22 adjacent thereto.

Near selection transistors, which are used to apply a voltage to the near memory cells in the second-level memory cells MC_L2, may be disposed in the near selection region NR of the second-level word line driver region 21_L2 and the near selection region NR of the bit line selection region 22 adjacent thereto. Far selection transistors, which are used to apply a voltage to the far memory cells in the second-level memory cells MC_L2, may be disposed in the far selection region FR of the second-level word line driver region 21_L2 and the far selection region FR of the bit line selection region 22 adjacent thereto. The near selection transistors and the far selection transistors may be configured to have substantially the same or similar features as those described with reference to FIGS. 4A to 10D.

Figure 17:
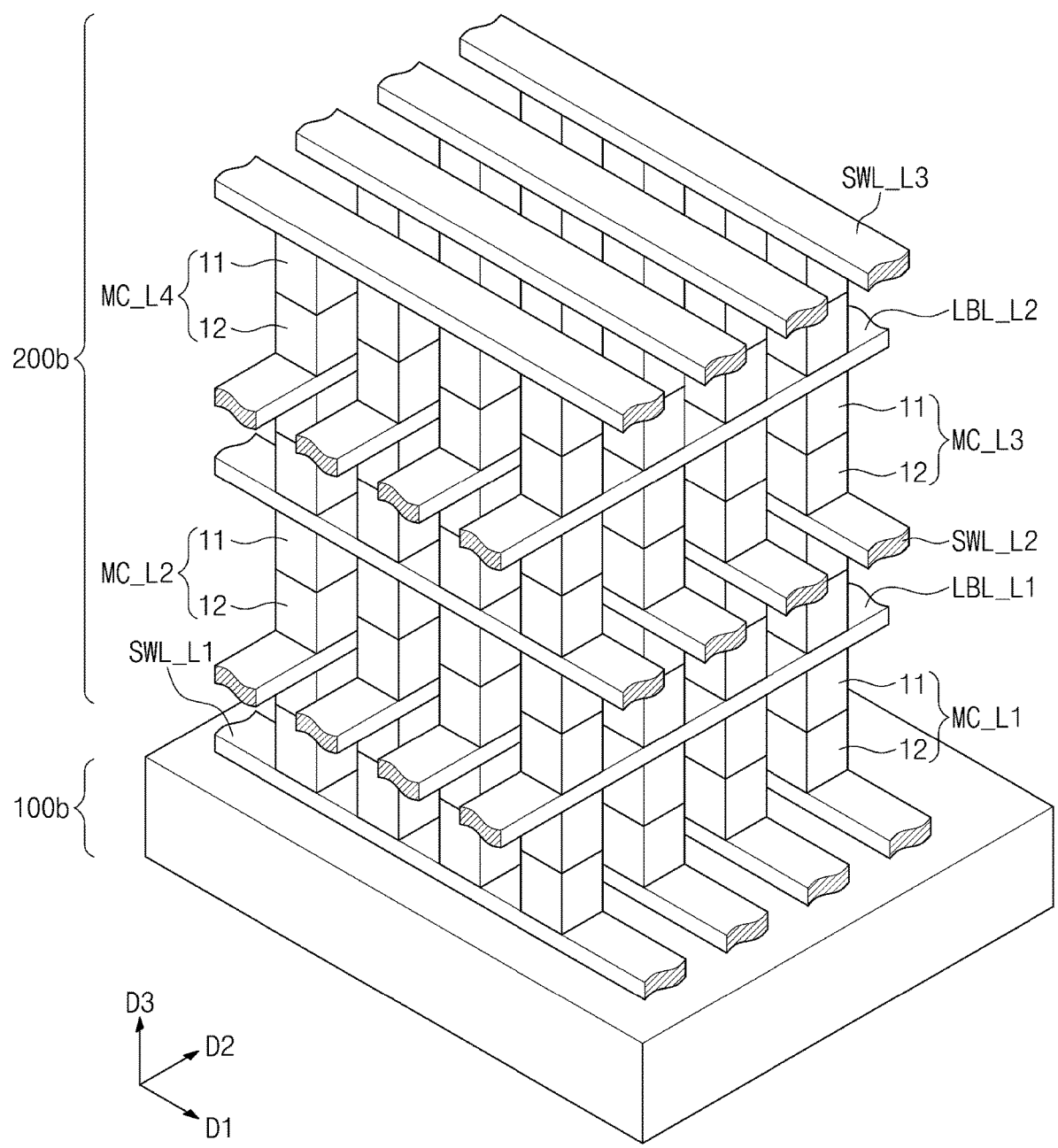
FIG. 17 is a perspective view illustrating a semiconductor memory device according to an embodiment of the inventive concept.
Figure 18:
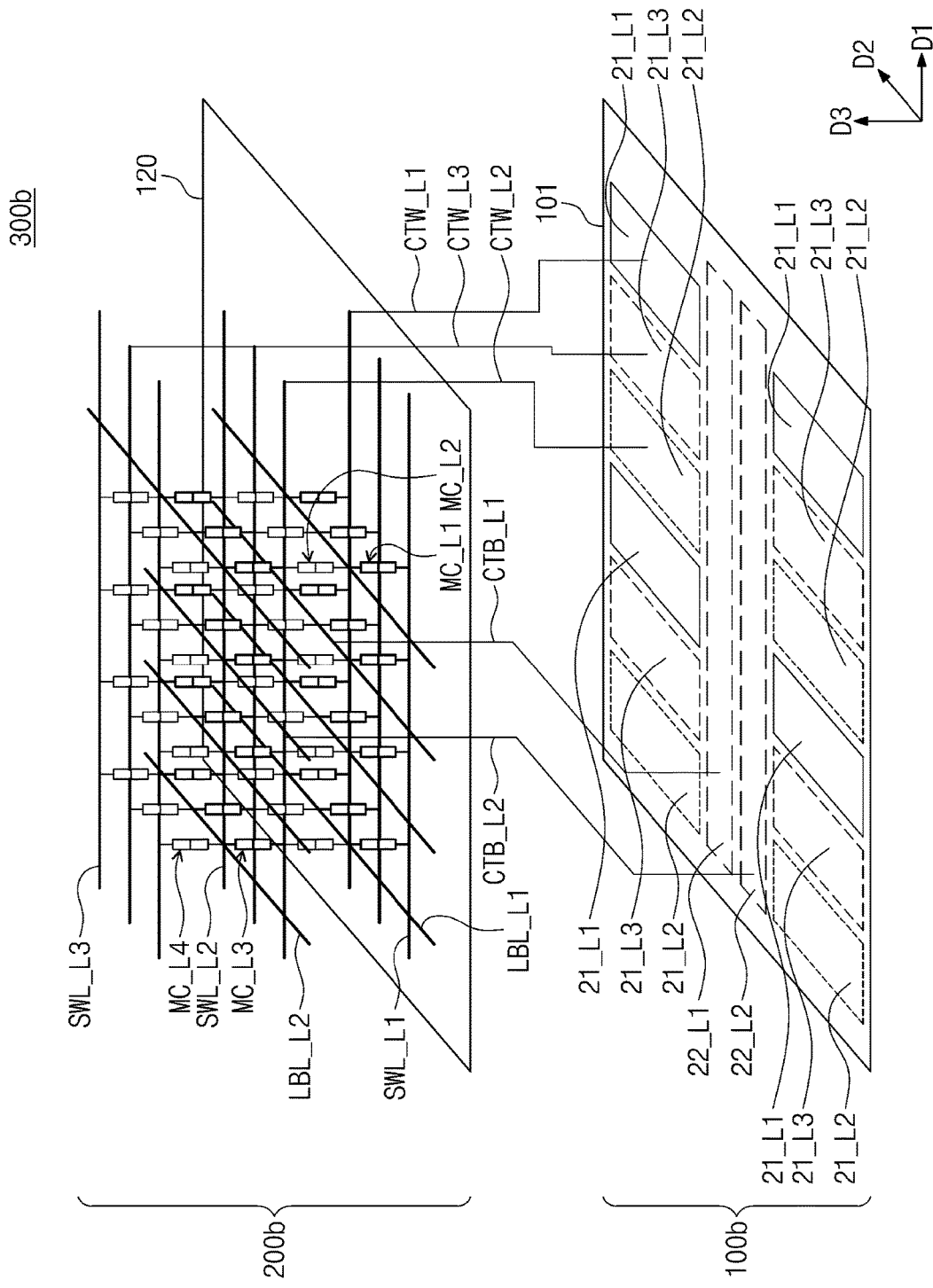
FIG. 18 is a perspective view illustrating a connection structure between a cell array portion and a peripheral circuit portion of FIG. 17.
Figure 19:
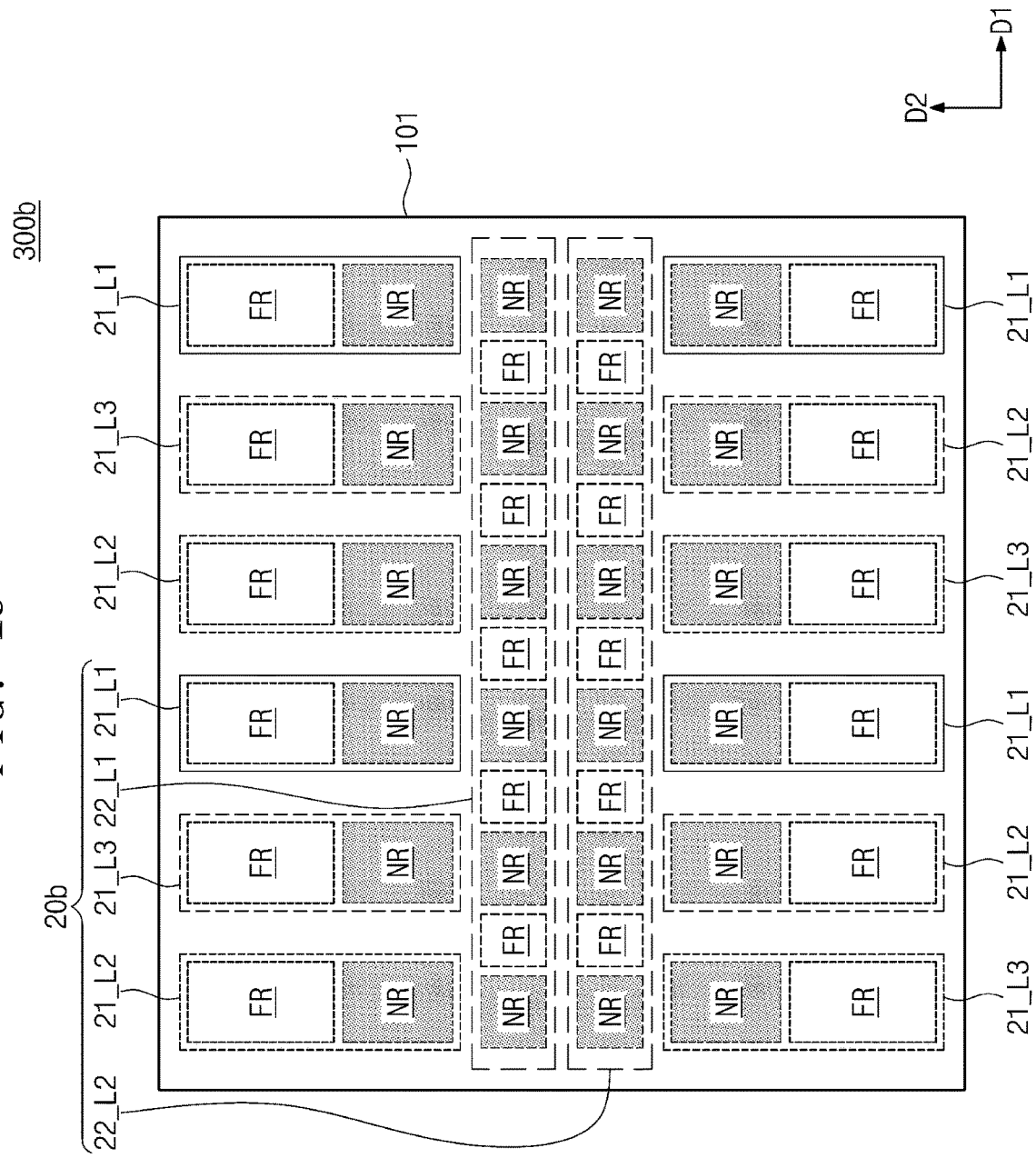
FIG. 19 is a plan view illustrating the peripheral circuit portion of FIG. 18.

FIG. 17 is a perspective view illustrating a semiconductor memory device according to an embodiment of the inventive concept. FIG. 18 is a perspective view illustrating a connection structure between a cell array portion and a peripheral circuit portion of FIG. 17. FIG. 19 is a plan view illustrating the peripheral circuit portion of FIG. 18.

Referring to FIGS. 17 to 19, in a semiconductor memory device 300b according to the present embodiment, a cell array portion 200b may be disposed on a peripheral circuit portion 100b. The cell array portion 200b may include the first-level sub-word lines SWL_L1, the first-level memory cells MC_L1, first-level local bit lines LBL_L1, the second-level memory cells MC_L2, the second-level sub-word lines SWL_L2, third-level memory cells MC_L3, second-level local bit lines LBL_L2, fourth-level memory cells MC_L4, and third-level sub-word lines SWL_L3, which are sequentially stacked.

A core region 20b may be disposed in the peripheral circuit portion 100b. The core region 20b may include a first-level bit line selection region 22_L1, a second-level bit line selection region 22_L2, the first-level word line driver region 21_L1, the second-level word line driver region 21_L2, and a third-level word line driver region 21_L3. The first-level bit line selection region 22_L1 and the second-level bit line selection region 22_L2 may be elongated in the first direction D1 and may be provided to cross the local bit lines LBL_L1 and LBL_L2.

The first-level word line driver region 21_L1, the second-level word line driver region 21_L2, and the third-level word line driver region 21_L3 may be provided in plural and may be disposed at both sides of the first-level bit line selection region 22_L1 or the second-level bit line selection region 22_L2. In an embodiment, a pair of the first-level word line driver regions 21_L1, a pair of the second-level word line driver regions 21_L2, and a pair of the third-level word line driver regions 21_L3 may be arranged such that they are alternately disposed along one side of the first-level bit line selection region 22_L1 or the second-level bit line selection region 22_L2.

Opposite end portions of each of the first-level sub-word lines SWL_L1 may be respectively connected to the first-level word line driver regions 21_L1 through the first-level word line connection contacts CTW_L1. Opposite end portions of each of the second-level sub-word lines SWL_L2 may be respectively connected to the second-level word line driver regions 21_L2 through the second-level word line connection contacts CTW_L2. Opposite end portions of each of the third-level sub-word lines SWL_L3 may be respectively connected to the third-level word line driver regions 21_L3 through third-level word line connection contacts CTW_L3.

An intermediate portion of each of the first-level local bit lines LBL_L1 may be connected to the first-level bit line selection region 22_L1 through a first-level bit line connection contact CTB_L1. An intermediate portion of each of the second-level local bit lines LBL_L2 may be connected to the second-level bit line selection region 22_L2 through a second-level bit line connection contact CTB_L2.

The near selection region NR and the far selection region FR may be disposed in each of the first-level bit line selection region 22_L1, the second-level bit line selection region 22_L2, the first-level word line driver region 21_L1, the second-level word line driver region 21_L2, and the third-level word line driver region 21_L3. The near selection transistors and the far selection transistors may be disposed in the near selection region NR and the far selection region FR, respectively, as described with reference to FIGS. 11 to 13. The near selection transistors and the far selection transistors may be configured to have substantially the same or similar features as those described with reference to FIGS. 4A to 10D.

Figure 20:
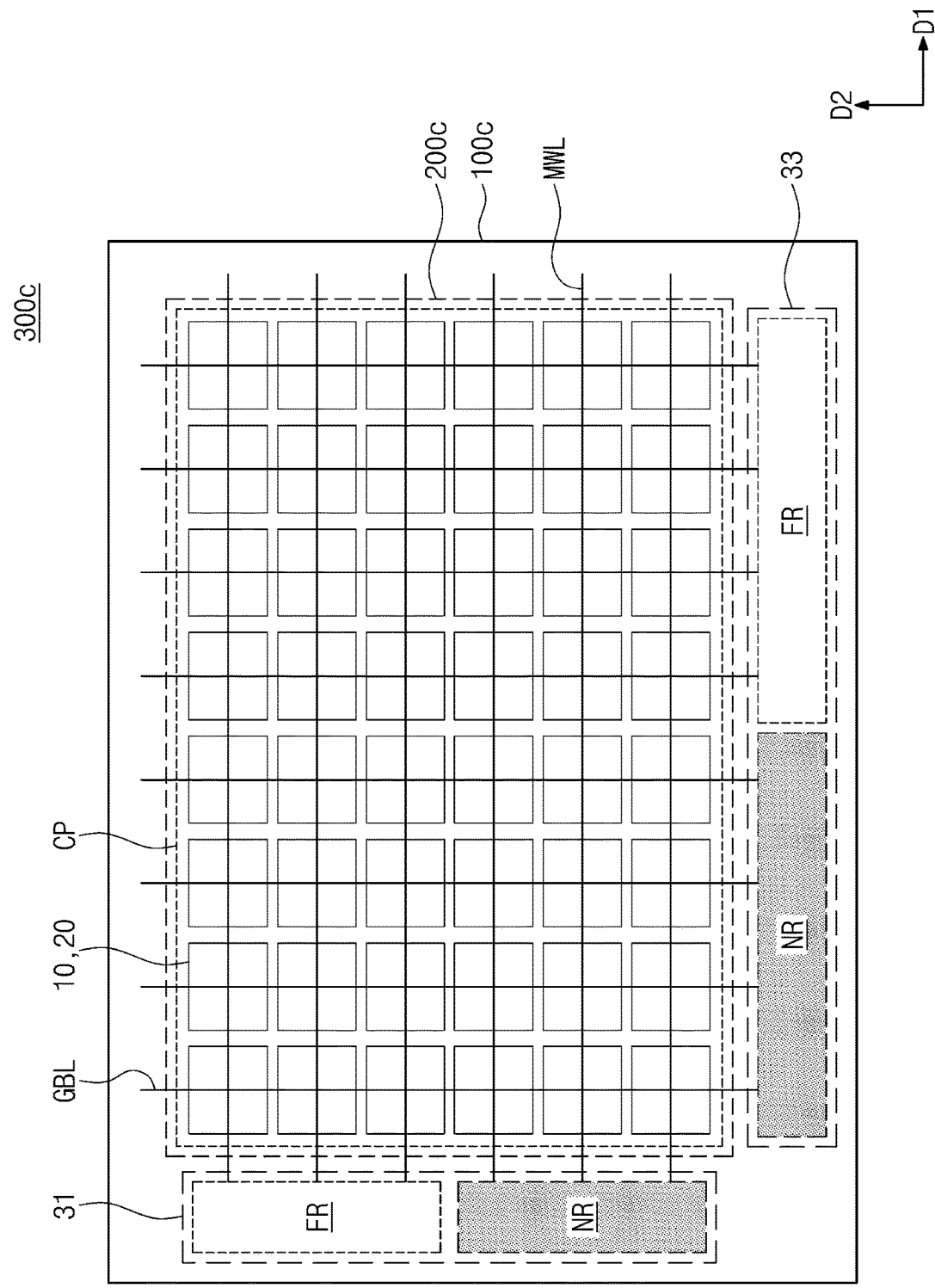
FIG. 20 is a plan view illustrating a semiconductor memory device according to an embodiment of the inventive concept.

FIG. 20 is a plan view illustrating a semiconductor memory device according to an embodiment of the inventive concept.

Referring to FIG. 20, in a semiconductor memory device 300c according to the present embodiment, a cell array portion 200c may be disposed on a peripheral circuit portion 100c. In the cell array portion 200c, the cell array regions 10 may be two-dimensionally arranged in the first direction D1 and the second direction D2. The local bit lines LBL, the sub-word lines SWL, and the memory cells MC may be disposed in each of the cell array region 10, as described with reference to FIGS. 11 to 19.

The peripheral circuit portion 100c may include a core portion CP, the address decoder 31, and the bit line selection unit 33. In the core portion CP, the core regions 20 may be two-dimensionally arranged in the first direction D1 and the second direction D2. The core regions 20 may overlap the cell array regions 10, respectively. The core portion CP may overlap the cell array portion 200c. The address decoder 31 and the bit line selection unit 33 may not overlap the cell array portion 200c and may be provided in a region outside the cell array portion 200c, when viewed in a plan view.

The main word lines MWL may be provided to cross the core regions 20 in the first direction D1 and may be connected to the address decoder 31. Main word line selection transistors may be disposed in the address decoder 31 and may be connected to the main word lines MWL, respectively.

The global bit lines GBL may cross the core regions 20 in the second direction D2 and may be connected to the bit line selection unit 33. Global bit line selection transistors may be disposed in the bit line selection unit 33 and may be respectively connected to the global bit lines GBL.

The near selection region NR and the far selection region FR may be disposed in each of the address decoder 31 and the bit line selection unit 33. Some of main word line selection transistors or global bit line selection transistors serving as the near selection transistors may be disposed in the near selection region NR to apply a voltage to near regions of the core regions 20 or the cell array regions 10. Others of the main word line selection transistors or the global bit line selection transistors serving as the far selection transistors may be disposed in the far selection region FR to apply a voltage to far regions of the core regions 20 or the cell array regions 10. The main word line selection transistors or the global bit line selection transistors serving as the near selection transistors may be the same as or similar to the near selection transistors described with reference to FIGS. 4A to 10B. The main word line selection transistors or the global bit line selection transistors serving as the far selection transistors may be the same as or similar to the far selection transistors described with reference to FIGS. 4A to 10B.

Figure 21:
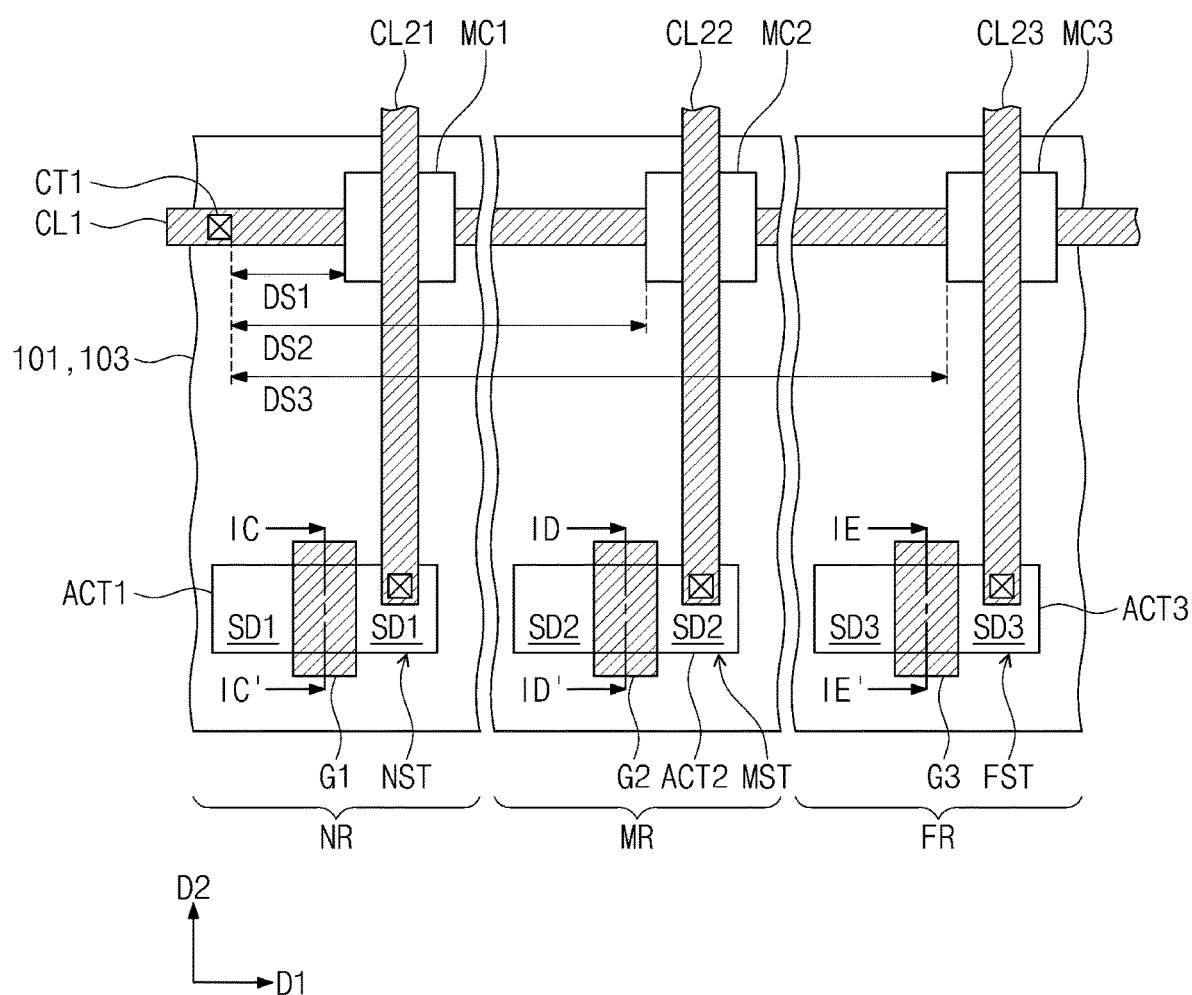
FIG. 21 is a plan view illustrating a semiconductor memory device according to an embodiment of the inventive concept.

FIG. 21 is a plan view illustrating a semiconductor memory device according to an embodiment of the inventive concept.

Referring to FIG. 21, the semiconductor memory device according to the present embodiment may include a substrate 101, a first conductive line CL1, which is provided on the substrate 101 and is extended in a first direction D1, and a 21-th conductive line CL21, a 22-th conductive line CL22, and a 23-th conductive line CL23, which are provided on the substrate 101 and are extended in a second direction D2. A first memory cell MC1 may be disposed between the first conductive line CL1 and the 21-th conductive line CL21 or at an intersection therebetween. A second memory cell MC2 may be disposed between the first conductive line CL1 and the 22-th conductive line CL22 or at an intersection therebetween. A third memory cell MC3 may be disposed between the first conductive line CL1 and the 23-th conductive line CL23 or at an intersection therebetween. An end portion of the first conductive line CL1 may be connected to a transistor, which is used to select the first conductive line CL1, through a first contact CT1.

The first memory cell MC1 may be spaced apart from the first contact CT1 by a first distance DS1, and the second memory cell MC2 may be spaced apart from the first contact CT1 by a second distance DS2. The third memory cell MC3 may be spaced apart from the first contact CT1 by a third distance DS3. The second distance DS2 may be larger than the first distance DS1 and smaller than the third distance DS3. When classified based on the distance from the first contact CT1, the first memory cell MC1 may correspond to the near memory cell, the second memory cell MC2 may correspond to the middle memory cell, and the third memory cell MC3 may correspond to the far memory cell.

The 21-th conductive line CL21 may be connected to a near selection transistor NST. The 22-th conductive line CL22 may be connected to a middle selection transistor MST. The 23-th conductive line CL23 may be connected to a far selection transistor FST. The substrate 101 may include a near selection region NR, a middle selection region MR, and a far selection region FR. The near selection transistor NST may be disposed in the near selection region NR, the middle selection transistor MST may be disposed in the middle selection region MR, and the far selection transistor FST may be disposed in the far selection region FR.

The threshold voltage of the middle selection transistor MST may be lower than that of the near selection transistor NST and may be higher than that of the far selection transistor FST. The impurity doping concentration of the channel region of the middle selection transistor MST may be higher than that of the near selection transistor NST and may be lower than that of the far selection transistor FST. The gate insulating layer of the middle selection transistor MST may be thinner than that of the near selection transistor NST and may be thicker than that of the far selection transistor FST.

Alternatively, the effective gate width of the middle selection transistor MST may be larger than that of the near selection transistor NST and may be smaller than that of the far selection transistor FST. In an embodiment, each of the selection transistors NST, MST, and FST may include the gate finger portions, as described with reference to FIGS. 5A to 6B. The number of the gate finger portions of the middle selection transistor MST may be greater than that of the near selection transistor NST and may be smaller than that of the far selection transistor FST.

In another embodiment, all the selection transistors NST, MST, and FST may have gate protruding portions, as described with reference to FIGS. 7A to 7D. When the gate protruding portions are provided to have the same width and the same depth, the number of the gate protruding portions in the middle selection transistor MST may be greater than that in the near selection transistor NST and may be smaller than that in the far selection transistor FST.

Figure 22A:
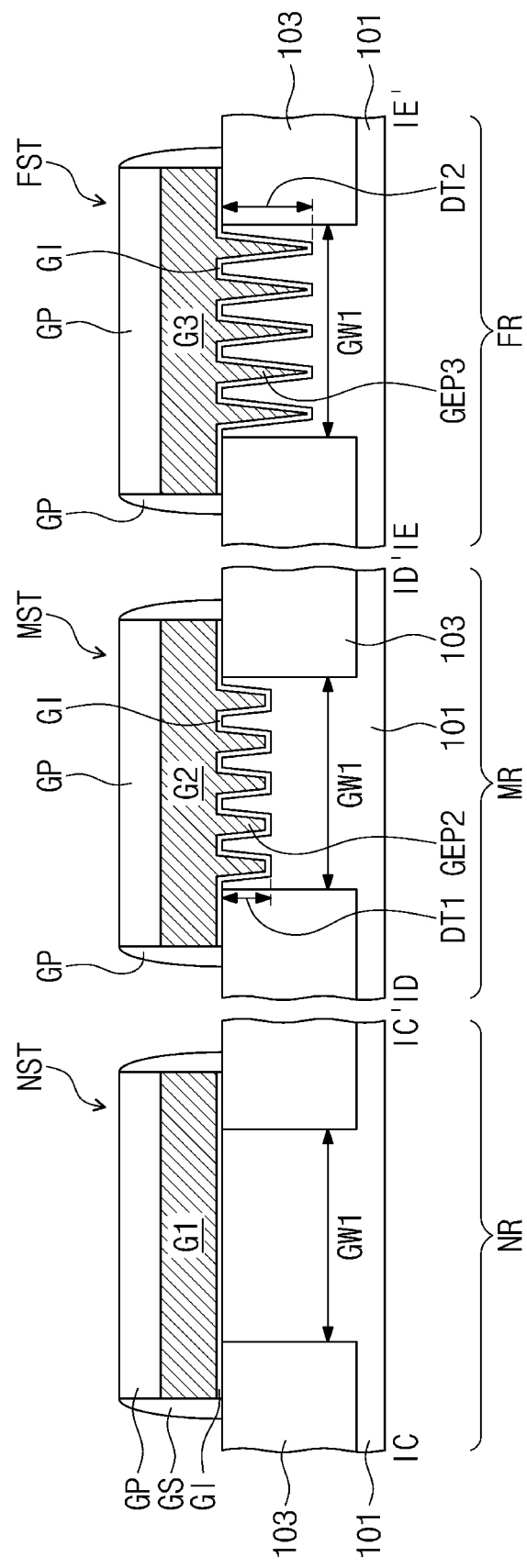
FIG. 22A is a sectional view taken along lines IB-IB', IC-IC', and ID-ID' of FIG. 21.

FIG. 22A is a sectional view taken along lines IB-IB', IC-IC', and ID-ID' of FIG. 21.

Referring to FIG. 22A, the near selection transistor NST may be a planar type transistor. A second gate electrode G2 of the middle selection transistor MST may have second gate protruding portions GEP2, which are inserted into the substrate 101. A third gate electrode G3 of the far selection transistor FST may have third gate protruding portions GEP3, which are inserted into the substrate 101. The number of the second gate protruding portions GEP2 may be equal to the number of the third gate protruding portions GEP3. However, a depth DT1 of the second gate protruding portions GEP2 may be smaller than a depth DT2 of the third gate protruding portions GEP3.

In another embodiment, all of the selection transistors NST, MST, and FST may have the FinFET structure shown in FIGS. 9A and 9B, and the number of the active fins of the middle selection transistor MST may be greater than that of the near selection transistor NST and smaller than that of the far selection transistor FST.

Figure 22B:
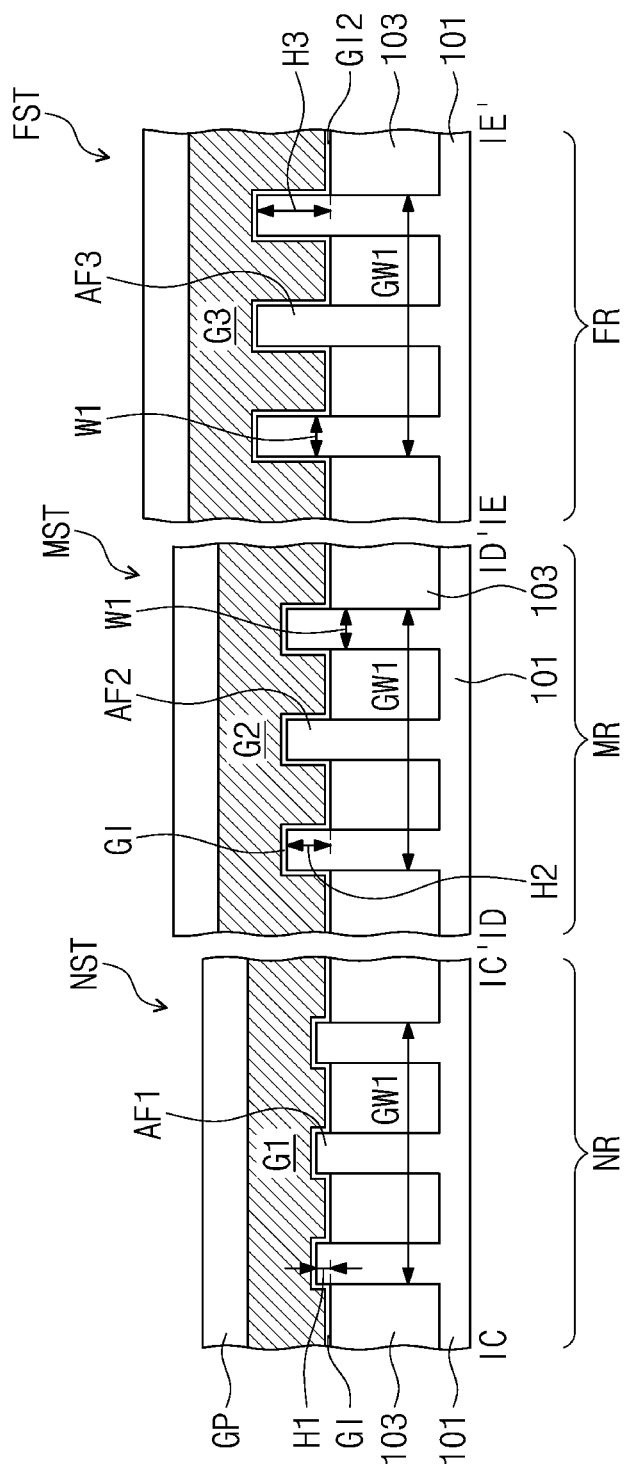
FIG. 22B is a sectional view taken along the lines IB-IB', IC-IC', and ID-ID' of FIG. 21.

FIG. 22B is a sectional view taken along the lines IB-IB', IC-IC', and ID-ID' of FIG. 21.

Referring to FIG. 22B, the number, width, and distance of second active fins AF2 of the middle selection transistor MST may be the same as those of first active fins AF1 of the near selection transistor NST and third active fins AF3 of the far selection transistor FST. However, a height H2 of the second active fins AF2 of the middle selection transistor MST may be greater than a height H1 of the first active fins AF1 of the near selection transistor NST and may be smaller than a height H3 of the third active fins AF3 of the far selection transistor FST.

In another embodiment, all of the selection transistors NST, MST, and FST may have the MBCFET structure shown in FIGS. 9A and 9B, and the number of the channel patterns of the middle selection transistor MST may be greater than that of the near selection transistor NST and smaller than that of the far selection transistor FST.

In the structures described with reference to FIGS. 11 to 20, the middle selection region MR may be further provided between the near selection region NR and the far selection region FR. In the present embodiment, the elements have been classified into three types (i.e., near, middle, and far elements), based on the distance, but the elements may be classified into four or more types, based on the distance. The embodiments described with reference to FIGS. 1 to 22B may be realized in a combined manner. In the present specification, each of the (sub/main) word line and the (local/global) bit line may be referred to as a 'conductive line'. In addition, the word line driver region and the bit line selection region may be referred to as a 'conductive line selection region'. Also, in the present application, each of the active region, the active fin, and the channel pattern may be referred to as an 'active portion'. Each of the source/drain region and the source/drain pattern may be referred to as a 'source/drain portion'.

According to an embodiment of the inventive concept, it may be possible to realize a highly-integrated semiconductor memory device, in which a peripheral circuit portion is disposed below a cell array portion. Selection transistors, which are used to select memory cells (e.g., near memory cells and far memory cells), may be designed to have different structures depending on distances therefrom, and in this case, it may be possible to control a distance-dependent voltage difference and thereby to prevent the memory cell from being damaged. In detail, a near selection transistor connected to the near memory cell may be configured to have a threshold voltage that is higher than that of a far selection transistor connected to the far memory cell, or the far selection transistor may be disposed to have an effective gate width that is larger than that of an effective gate width of the near selection transistor. In this case, it may be possible to prevent the near memory cell from being damaged and to prevent an operational failure from occurring in the semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a device isolation layer provided in a substrate to define a first active portion and a second active portion;
a first contact disposed on the substrate;
a first memory cell and a second memory cell, which are spaced apart from the first contact in a first direction by a first distance and a second distance, respectively;
a first conductive line connected to the first memory cell and extending in a second direction crossing the first direction;
a second conductive line connected to the second memory cell and extending in the second direction;

a first selection transistor connected to the first conductive line and including the first active portion; and a second selection transistor connected to the second conductive line and including the second active portion, wherein the first selection transistor comprises a first gate electrode crossing the first active portion in a third direction, the third direction being the same as or different from the second direction, the second selection transistor comprises a second gate electrode crossing the second active portion in the third direction, and a length of a bottom surface of the first gate electrode, which overlaps the first active portion in the third direction, is different from a length of a bottom surface of the second gate electrode, which overlaps the second active portion in the third direction.

2. The semiconductor memory device of claim 1, wherein the second gate electrode comprises a plurality of second gate finger portions, which are spaced apart from each other in a fourth direction and are provided to cross the second active portion in the third direction, the fourth direction being perpendicular to the third direction.

3. The semiconductor memory device of claim 2, wherein the first gate electrode comprises a plurality of first gate finger portions, which are spaced apart from each other in the fourth direction and are provided to cross the first active portion in the third direction, and the number of the second gate finger portions is greater than the number of the first gate finger portions.

4. The semiconductor memory device of claim 1, wherein the second gate electrode comprises at least one first gate protruding portion inserted into the second active portion.

5. The semiconductor memory device of claim 4, wherein the first gate electrode comprises at least one second gate protruding portion inserted into the first active portion, and the number of the second gate protruding portions is greater than the number of the first gate protruding portions.

6. The semiconductor memory device of claim 4, wherein the first gate electrode comprises at least one second gate protruding portion inserted into the first active portion, and a depth of the first gate protruding portion is smaller than a depth of the second gate protruding portion.

7. The semiconductor memory device of claim 1, wherein each of the first active portion and the second active portion protrudes above a top surface of the device isolation layer, the first gate electrode covers side and top surfaces of the first active portion, the second gate electrode covers side and top surfaces of the second active portion, each of the first active portion and the second active portion is provided in plural, and the number of the first active portions is less than the number of the second active portions.

8. The semiconductor memory device of claim 1, wherein each of the first active portion and the second active portion protrudes above a top surface of the device isolation layer, the first gate electrode covers side and top surfaces of the first active portion, the second gate electrode covers side and top surfaces of the second active portion, and a height of the first active portion is smaller than a height of the second active portion.

9. The semiconductor memory device of claim 1, wherein each of the first active portion and the second active portion protrudes above a top surface of the device isolation layer, the first selection transistor further comprises at least one first channel pattern stacked on the first active portion, the second selection transistor further comprises at least one second channel pattern stacked on the second active portion, the first gate electrode covers side and top surfaces of the first active portion and the first channel pattern and is interposed between the first active portion and the first channel pattern, the second gate electrode covers side and top surfaces of the second active portion and the second channel pattern and is interposed between the second active portion and the second channel pattern, and the number of first channel patterns is less than the number of second channel patterns.

10. The semiconductor memory device of claim 1, wherein the first selection transistor and the second selection transistor are disposed below the first conductive line and the second conductive line, and the semiconductor memory device comprises:

a first interlayer insulating layer provided below the first conductive line and the second conductive line to cover the first selection transistor and the second selection transistor;

a second contact penetrating the first interlayer insulating layer and connecting the first conductive line to the first selection transistor; and a third contact penetrating the first interlayer insulating layer and connecting the second conductive line to the second selection transistor.

11. The semiconductor memory device of claim 10, further comprising:

a third conductive line connecting the first contact, the first memory cell, and the second memory cell in the first direction;

a fourth conductive line extended in the first direction and spaced apart from the second contact with the first conductive line interposed between the second contact and the fourth conductive line;

a third selection transistor connected to the third conductive line; and a fourth selection transistor connected to the fourth conductive line, wherein a threshold voltage of the third selection transistor is higher than a threshold voltage of the fourth selection transistor.

12. The semiconductor memory device of claim 11, wherein the first active portion and the second active portion are doped with a first impurity, the third selection transistor comprises a barrier region, which is disposed in the first active portion below the first gate electrode, and the barrier region is doped with the first impurity, the barrier region having a concentration of the first impurity higher than a concentration of the first impurity in the second active portion.

13. The semiconductor memory device of claim 11, wherein the first selection transistor comprises a first gate insulating layer, the second selection transistor comprises a second gate insulating layer, and the first gate insulating layer is thicker, in a fourth direction perpendicular to the first and second directions, than the second gate insulating layer.

14. The semiconductor memory device of claim 1, further comprising:
- a third memory cell spaced apart from the first contact in the first direction by a third distance;
- a third conductive line connected to the third memory cell and extending in the second direction; and
- a third selection transistor connected to the third conductive line,
- wherein the device isolation layer further defines a third active portion in the substrate,
- the third selection transistor comprises a third gate electrode, which is provided to cross the third active portion, and third source/drain portions, which are disposed at both sides of the third gate electrode,
- a bottom surface of the third gate electrode has a length overlapping the third active portion in the third direction between the third source/drain portions
- the second distance is smaller than the third distance, and
- the length of a bottom surface of the second gate electrode, which overlaps the second active portion in the third direction is smaller than the length of a bottom surface of the third gate electrode, which overlaps the third active portion in the third direction.

15. The semiconductor memory device of claim 1, wherein the first distance is smaller than the second distance, and
- a length of the bottom surface of the first gate electrode, which overlaps the first active portion in the third direction, is smaller than a length of the bottom surface of the second gate electrode, which overlaps the second active portion in the third direction.

16. A semiconductor memory device, comprising:
- a first lower conductive line disposed on a substrate;
- a first upper conductive line and a second upper conductive line, which cross over the first lower conductive line and are parallel to each other, the first upper conductive line being closer to an end portion of the first lower conductive line than the second upper conductive line;
- a first memory cell interposed between the first lower conductive line and the first upper conductive line;
- a second memory cell interposed between the first lower conductive line and the second upper conductive line;
- a first selection transistor connected to the first upper conductive line; and
- a second selection transistor connected to the second upper conductive line,
- wherein the first selection transistor has a first gate electrode,
- the second selection transistor has a second gate electrode,
- the first gate electrode comprises at least one first gate protruding portion inserted into the substrate, and
- an effective gate width of the first gate electrode is larger than an effective gate width of the second gate electrode.

17. The semiconductor memory device of claim 16, wherein the second gate electrode comprises at least one second gate protruding portion inserted into the substrate, and
- the number of first gate protruding portions is greater than the number of the second gate protruding portions.

* * * * *